(12) United States Patent
Nishiwaki

(10) Patent No.: US 8,884,364 B2
(45) Date of Patent: *Nov. 11, 2014

(54) SEMICONDUCTOR DEVICE WITH FIELD-PLATE ELECTRODE

(71) Applicant: Kabushiki Kaisha Toshiba, Tokyo (JP)

(72) Inventor: Tatsuya Nishiwaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/094,570

(22) Filed: Dec. 2, 2013

(65) Prior Publication Data

US 2014/0084365 A1    Mar. 27, 2014

Related U.S. Application Data

(62) Division of application No. 13/053,069, filed on Mar. 21, 2011, now Pat. No. 8,629,505.

(30) Foreign Application Priority Data

Sep. 9, 2010  (JP) ................................. 2010-202068

(51) Int. Cl.
| | |
|---|---|
| *H01L 29/66* | (2006.01) |
| *H01L 29/40* | (2006.01) |
| *H01L 29/78* | (2006.01) |
| H01L 29/423 | (2006.01) |
| H01L 29/417 | (2006.01) |
| H01L 29/06 | (2006.01) |

(52) U.S. Cl.
CPC ......... *H01L 29/7813* (2013.01); *H01L 29/4238* (2013.01); *H01L 29/41741* (2013.01); *H01L 29/0696* (2013.01); *H01L 29/407* (2013.01); *H01L 29/66734* (2013.01); *H01L 29/41766* (2013.01)

USPC ........................... 257/331; 257/330; 257/367

(58) Field of Classification Search
USPC ......................................... 257/330, 331, 367
See application file for complete search history.

(56) References Cited

U.S. PATENT DOCUMENTS

| | | |
|---|---|---|
| 5,998,833 A | 12/1999 | Baliga |
| 6,339,243 B1 | 1/2002 | Kwon et al. |

(Continued)

FOREIGN PATENT DOCUMENTS

| | | |
|---|---|---|
| JP | 2002-083963 A | 3/2002 |
| JP | 2010062557 A | 3/2010 |

OTHER PUBLICATIONS

Japanese Office Action dated Feb. 24, 2014, filed in Japanese counterpart Application No. 2010-202068, 4 pages (with translation).

(Continued)

*Primary Examiner* — Nicholas Tobergte
(74) *Attorney, Agent, or Firm* — Patterson & Sheridan, LLP

(57) ABSTRACT

A semiconductor device includes: a drain layer; a drift layer provided on the drain layer; a base region provided on the drift layer; a source region selectively provided on a surface of the base region; a first gate; a field-plate; a second gate; a drain electrode; and a source electrode. The first gate electrode is provided in each of a plurality of first trenches via a first insulating film. The first trenches penetrate from a surface of the source region through the base region and contact the drift layer. The field-plate electrode is provided in the first trench under the first gate electrode via a second insulating film. The second gate electrode is provided in a second trench via a third insulating film. The second trench penetrates from the surface of the source region through the base region and contacts the drift layer between the first trenches.

20 Claims, 16 Drawing Sheets

(56) References Cited

U.S. PATENT DOCUMENTS

| | | |
|---|---|---|
| 6,844,592 B2 | 1/2005 | Yamaguchi et al. |
| 7,345,342 B2 | 3/2008 | Challa et al. |
| 7,485,921 B2 | 2/2009 | Kawaguchi et al. |
| 7,612,408 B2 | 11/2009 | Zundel et al. |
| 7,800,176 B2 | 9/2010 | Werner |
| 8,076,719 B2 | 12/2011 | Zeng et al. |
| 8,299,523 B2 | 10/2012 | Tomita et al. |
| 8,466,025 B2 | 6/2013 | Zeng et al. |
| 8,502,305 B2 | 8/2013 | Ohta et al. |
| 8,629,505 B2 * | 1/2014 | Nishiwaki .................... 257/367 |
| 2002/0030237 A1 | 3/2002 | Omura et al. |
| 2004/0041207 A1 | 3/2004 | Takano et al. |
| 2009/0140327 A1 | 6/2009 | Hirao et al. |
| 2010/0052044 A1 | 3/2010 | Hirler |
| 2011/0039384 A1 | 2/2011 | Darwish |

OTHER PUBLICATIONS

Japanese Office Action dated Jul. 26, 2013, filed in Japanese counterpart Application No. 2010-202068, 6 pages (with translation).
Japanese Office Action dated Jan. 23, 2013, filed in Japanese counterpart Application No. 2010-202068, 10 pages (with translation).

* cited by examiner

FIRST DIRECTION ↑
→ SECOND DIRECTION

FIRST DIRECTION

SECOND DIRECTION

SEMICONDUCTOR DEVICE WITH FIELD-PLATE ELECTRODE

CROSS-REFERENCE TO RELATED APPLICATIONS

This application is a division of U.S. patent application Ser. No. 13/053,069, filed on Mar. 21, 2011, which is based upon and claims the benefit of priority from the prior Japanese Patent Application No. 2010-202068, filed on Sep. 9, 2010; the entire contents of each of which are incorporated herein by reference.

FIELD

Embodiments described herein relate generally to semiconductor device.

BACKGROUND

In a power MOSFET (Metal Oxide Semiconductor Field Effect Transistor) with an upper and lower electrode structure, in order to maintain an element breakdown voltage at the time of switching off, impurity concentration and film thickness of a drift layer are adjusted to be within a predetermined range, respectively. The impurity concentration and film thickness of the drift layer are restricted by a limitation of physical-properties of a semiconductor material forming the drift layer. For this reason, a trade-off relation arises between the element breakdown voltage and on-resistance.

There is an MOSFET with a field plate electrode that is electrically connected to a source electrode or the gate electrode. The field plate electrode is located under a trench-type gate electrode. Since the field plate electrode is provided under the gate electrode, space charges derived from impurities in the drift layer are canceled, allowing electric fields generated in the drift layer to approach a constant value. Thus, the impurity concentration of the drift layer can be increased without decreasing the element breakdown voltage, enabling to reduce the on-resistance of the MOSFET provided with the field plate electrode.

On the other hand, in the MOSFET provided with the field plate electrode there is a possibility that density of channels increases and resistance of the drift layer decreases by making cell pitches fine and increasing the impurity concentration of the drift layer. According to this method, the on-resistance may be reduced further.

However, even if the cell pitch is made fine, if the impurity concentration of the drift layer becomes equal to or greater than a predetermined value, influence of impurity scattering of carriers will be large. For this reason, the method mentioned above has a limitation with regard to reduction of on-resistance.

DETAILED DESCRIPTION

Figure 1A:
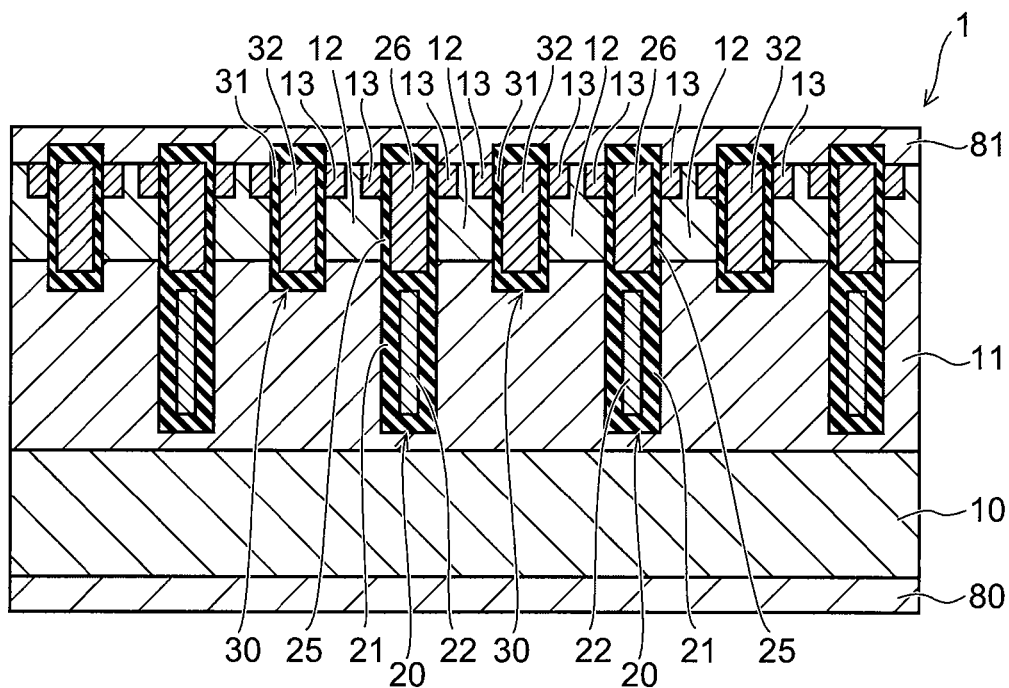
FIGS. 1A and 1B are schematic views of a main part each illustrating a semiconductor device according to the first embodiment.

In general, according to one embodiment, a semiconductor device includes: a drain layer; a drift layer provided on the drain layer; a base region provided on the drift layer; a source region selectively provided on a surface of the base region; a first gate; a field-plate; a second gate; a drain electrode; and a source electrode. The first gate electrode is provided in each of a plurality of first trenches via a first insulating film. The first trenches penetrate from a surface of the source region through the base region and contact the drift layer. The field-plate electrode is provided in the first trench under the first gate electrode via a second insulating film. The second gate electrode is provided in a second trench via a third insulating film. The second trench penetrates from the surface of the source region through the base region and contacts the drift layer between the first trenches.

According to another embodiment a semiconductor device includes: a drain layer of a first conductivity type; a drift layer of the first conductivity type provided on the drain layer; a drift region of a second conductivity type provided on the drift layer; a source region of the first conductivity type provided on a surface of the base region; a contact region provided in each of a plurality of first trenches, the first trenches penetrating from a surface of the source region through the base region and contacting the drift layer; a field-plate electrode provided in the first trench under the contact region via a first insulating film, a gate electrode provided in a second trench via the first insulating film, the second trench penetrating from the surface of the source region through the base region and contacting the drift layer between the first trenches; a drain electrode connected to the drain layer; and a source electrode connected to the source region and the contact region.

Exemplary embodiments will now be described with reference to the drawings. Similar components in the drawings are marked with like reference numerals.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Hereinafter, with reference to drawings, a first embodiment will be described.

Figure 1B:
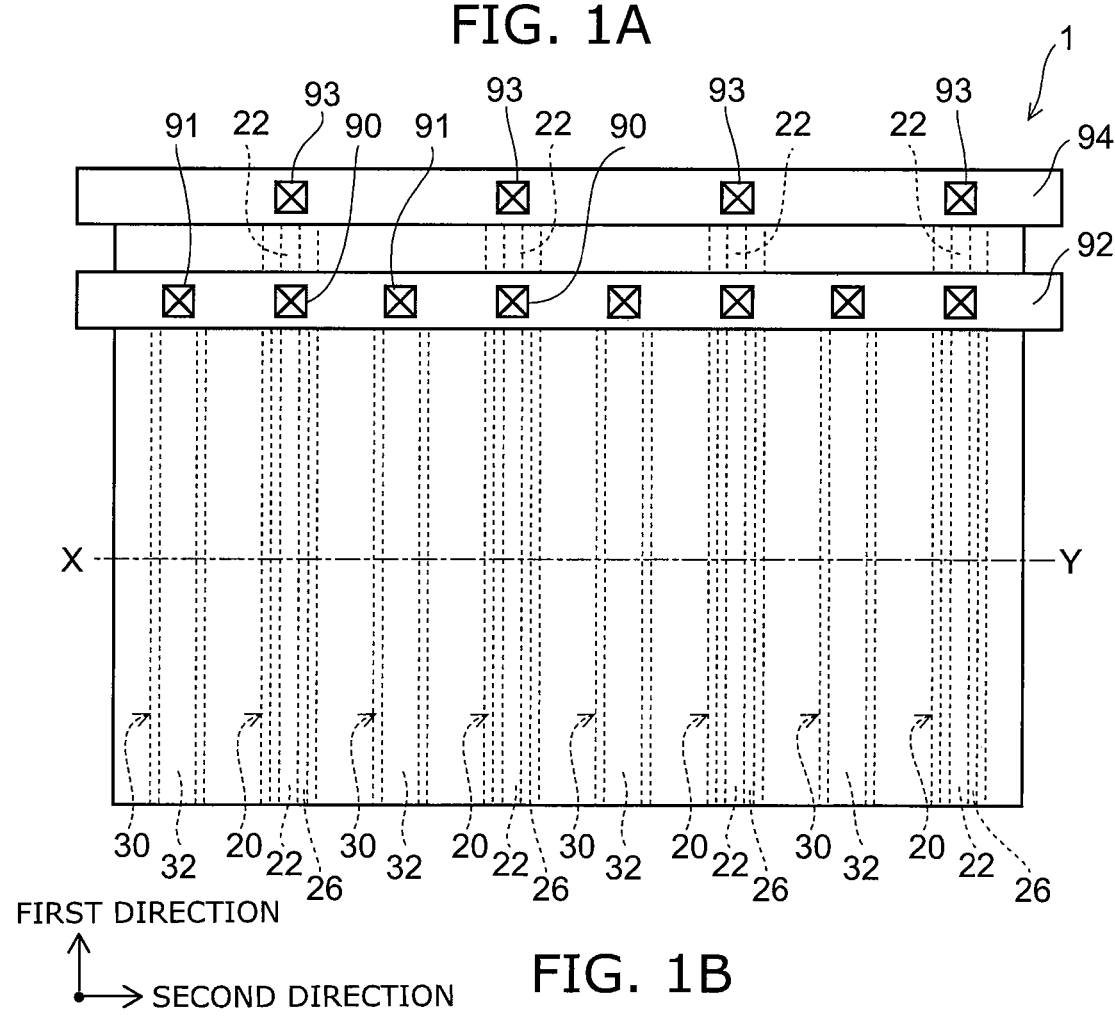

FIGS. 1A and 1B are schematic views of a main part each illustrating a semiconductor device according to the first embodiment. FIG. 1A is a schematic cross-sectional view of a main part of the device at X-Y position in FIG. 1B, and FIG. 1B is a schematic plan view of a main part of the device.

A semiconductor device 1 is a power MOSFET with an upper and lower electrode structure, and as illustrated in FIG. 1A, it includes an n-type (first conductive type) drain layer 10, an n-type drift layer 11 provided on the drain layer 10, and a p-type (second conductive type) base region 12 provided on the drift layer 11. On the surface of the base region 12, an n-type source region 13 is selectively provided.

In the semiconductor device 1, a plurality of first trenches 20 are provided, each penetrating from the surface of the source region 13 through the base region 12 so as to contact the drift layer 11. On the lower side in the trench 20, a field-plate electrode 22 is provided via a field-plate insulating film 21. Above the field plate electrode 22, a gate electrode 26 is provided. The gate electrode 26 is provided in the trench 20 via a gate insulating film 25. The thickness of the field-plate insulating film 21 is larger than that of the gate insulating film 25.

Between the respective trenches 20, a second trench 30 is provided, penetrating from the surface of the source region 13 through the base region 12 so as to contact the drift layer 11. A gate electrode 32 is provided in the trench 30 via the gate insulating film 31. The lower end of the trench 30 is located at a position shallower than that of the trench 20. The lower end of the trench 20 is located at a position deeper than that of the trench 30. The trench 20 and the trench 30 are arranged alternately in a direction substantially parallel with the surface of the base region 12.

The drain layer 10 is connected to a drain electrode 80. A source electrode 81 is connected to the source region 13 and the base region 12.

As illustrated in FIG. 1B, when viewed from a direction perpendicular to the main surface of the drift layer 11, the trenches 20 and the trenches 30 extend substantially in parallel with each other. The direction to which the trenches 20 and the trenches 30 extend is defined as a first direction. As a result, the gate electrodes 26, the field-plate electrodes 22 below the gate electrodes 26 and the gate electrodes 32 neighboring to the gate electrodes 26 extend substantially in parallel with each other in a stripe-shape.

Each of the gate electrodes 26 is connected to a common gate wiring 92 via a gate contact 90 at the end of the semiconductor device 1. Each of the gate electrode 32 is connected to the gate wiring 92 via a gate contact 91 at the end thereof. Each of the field plate electrodes 22 is connected to a common field plate wiring 94 via a gate contact 93 at the end thereof.

A pitch between the trenches 20 is set to be 0.6 μm (micron) or more. Impurity concentration of the drift layer 11 is designed to be $1 \times 10^{17}$ (atoms/cm$^3$) or less, when the pitch between the trenches 20 is set to be 0.6 μm. The minimum value of the pitch of the trenches 20 is 0.6 μm. The maximum value of the impurity concentration of the drift layer 11 is $1 \times 10^{17}$ (atoms/cm$^3$). In the semiconductor device 1, a trench 30 is further provided in the drift layer 11 between the trenches 20 at a pitch of this value.

The main constituent of the drain layer 10, the drift layer 11, the base region 12, and the source region 13 is silicon (Si). The material of the gate electrode 26, the gate electrode 32, and the field plate electrode 22 is polysilicon (poly-Si). The material of the gate insulating film 25, the gate insulating film 31, and the field plate insulating film 21 is oxide silicon (SiO$_2$). The materials of the drain electrode 80, the source electrode 81, the gate contact 90, the gate contact 91, the gate wiring 92, the gate contact 93, and the field plate wiring 94 are, for example, aluminium (Al), copper (Cu), tungsten (W), and polysilicon, etc.

Action and effect of the semiconductor device 1 will be described.

Before describing the action and the effect, action and effect of a semiconductor device 100 according to a comparative example will be described.

Figure 2:
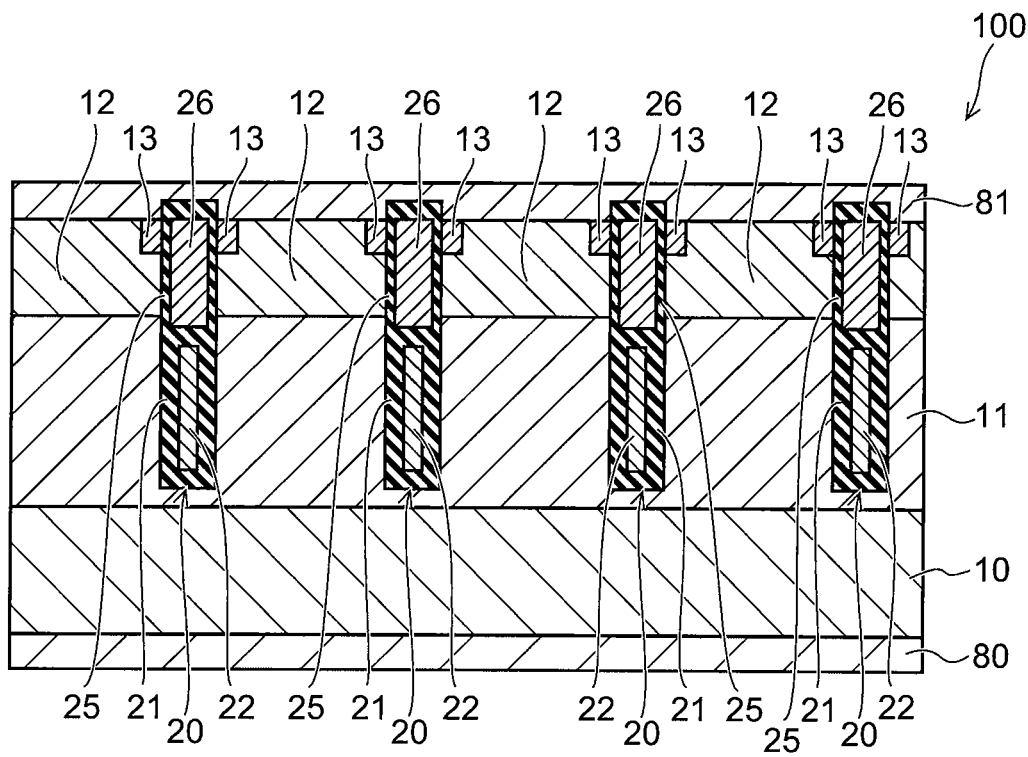
FIG. 2 is a schematic cross-sectional view of a main part illustrating a semiconductor device according to the comparative example.

FIG. 2 is a schematic cross-sectional view of a main part illustrating a semiconductor device according to the comparative example.

A semiconductor device 100 is not provided with trenches 30 like those provided in the semiconductor device 1. The semiconductor device 100 is provided with trenches 20, and a field-plate electrode 22 is provided on each of the trenches 20 via a field-plate insulating film 21. Furthermore, a gate electrode 26 is provided on each of the field-plate electrodes 22.

When the semiconductor device 100 is switched on, if a voltage, not less than a threshold voltage, is applied to the gate electrode 26, a channel will be formed in a base region 12 facing the gate electrode 26 via the gate insulating film 25. Then, current flows between the source electrode 81 and the drain electrode 80 through the source region 13, the channel, the drift layer 11, and the drain layer 10.

When the semiconductor device 100 is switched off, as a result of formation of the field-plate electrode 22, even if space charges (positive charges) will be generated due to impurities contained in the drift layer 11, the space charges and negative charges induced on the surface of the field-plate electrode 22 cancel each other. For this reason, the drift layer 11 is depleted in a large range. Thereby, in the semiconductor device 100, a depletion layer tends to extend toward the drift layer 11 from an interface between the trench 20 and the drift layer 11. The extended depletion layers connect to each other to deplete the entire drift layer 11. As a result the semiconductor device keeps its high breakdown voltage. In the semiconductor device 100, since a depletion layer easily extends, impurity concentration of the drift layer 11 can be made higher than that of a case where the field plate electrode 22 is not provided. As a result, in the semiconductor device 100, the on-resistance can be reduced to a predetermined resistance value.

However, if impurity concentration (for example, doping concentration of phosphorus (P)) of the drift layer 11 becomes excessive, in some cases mobility in the drift layer 11 may decrease conversely due to the impurity scattering of carriers. Therefore, the impurity concentration of the drift layer 11 is adjusted to be within a range where the mobility of the drift layer 11 does not decrease. When the main constituent of the drift layer 11 is silicon, the range of the impurity concentration where the mobility of the drift layer 11 does not decrease, is substantially equal to or smaller than $1 \times 10^{17}$ (atoms/cm$^3$).

The minimum pitch of the trenches 20 of the semiconductor device 100 is determined within a range where the mobility of the drift layer 11 does not decrease. For example, when impurity concentration of the drift layer 11 of the minimum pitch of trenches 20 is around $1 \times 10^{17}$ (atoms/cm$^3$), the pitch will be determined under a condition where the space charges at the concentration in the drift layer 11 can be relaxed to completely deplete the drift layer 11 and the on-resistance of the drift layer 11 is not increased by narrowing the pitch. In other words, a method where impurity concentration is simply increased by reducing a cell pitch (or the pitch of the trenches 20) will have a limitation against reduction of the on-resistance of the semiconductor device 100.

For example, the following definitions are adopted: $\mu_n$: mobility; $N_d$: impurity concentration (doping concentration); L: film thickness (layer thickness) of the drift layer 11 between the field-plate electrodes 22; q: elementary electric charge; $W_{si}$: width of the drift layer 11 between the field-plate electrodes 22; $t_{ox}$: thickness of the field-plate insulating film 21; and $W_{fp}$: width of the field-plate electrode 22. Where, "width" or "thickness" of each member is the length of the member in a direction along which the trenches 20 are arranged periodically. ($W_{si}+2t_{ox}+W_{fp}$) corresponds to the cell pitch (or the pitch of the trenches 20).

It is known that resistance $R_{dr}$ of the drift layer 11 near the field-plate electrode 22 is proportional to the following formula (1) (for example, refer to Ying Wang, Hai-Fan Hu, Wen-Li Jiao, and Chao Cheng, IEEE Electron Device Letters, vol 31, No 4, (2010), pp. 338-340):

$$(L/(q \times \mu_n \times N_d)) \times ((W_{si}+2t_{ox}+W_{fp})/W_{si}) \qquad (1)$$

For example, resistance $R_{dr}$ depends on the mobility and impurity concentration included in ($L/(q \times \mu_n \times N_d)$) in formula (1), and also depends on the cell pitch and width of the drift layer 11 between the field-plate electrodes 22 included in ($W_{si}+2t_{ox}+W_{fp}$)/$W_{si}$).

For example, resistance $R_{dr}$ becomes higher, if at least one of $\mu_n$ or $N_d$ becomes lower. Moreover, if the cell pitch ($W_{si}+2t_{ox}+W_{fp}$) becomes wider, the resistance $R_{dr}$ becomes higher because the channel density is reduced. Furthermore, if the width $W_{si}$ of the drift layer 11 between the field-plate electrodes 22 becomes narrower, the resistance $R_{dr}$ becomes higher because a path of current flowing in the drift layer 11 becomes narrower.

Figure 3:
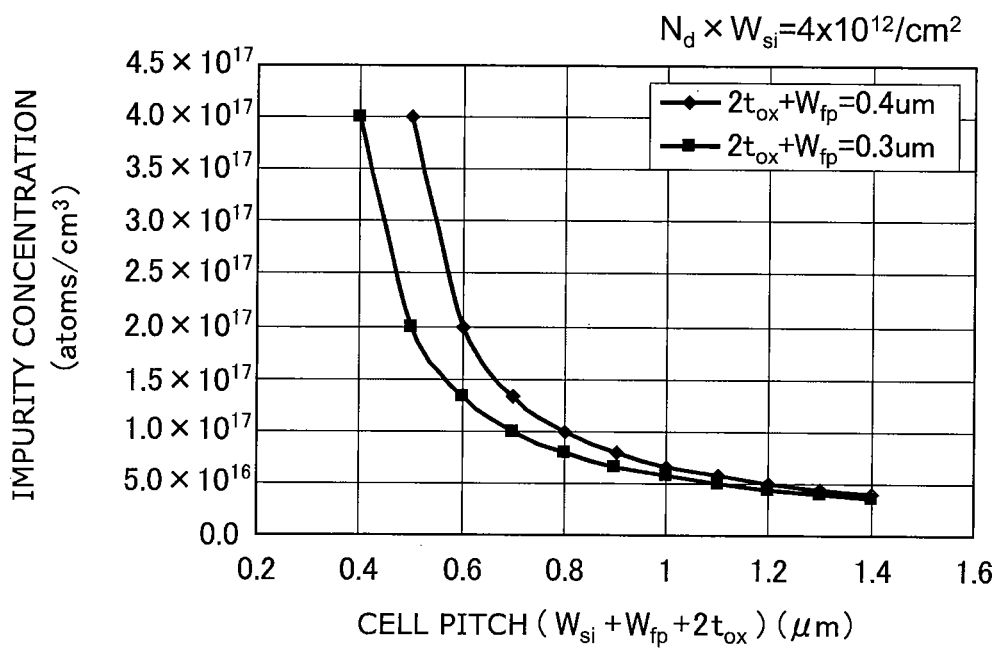
FIG. 3 is a graph illustrating the relationship between the cell pitch and the impurity concentration.

FIG. 3 is a graph illustrating the relationship between the cell pitch and the impurity concentration. The semiconductor material is silicon (Si). The transverse axis indicates the cell pitch (($W_{si}+2t_{ox}+W_{fp}$) (μm)), and the vertical axis indicates the impurity concentration (atoms/cm$^3$). In FIG. 3, curves of a case where the width of the trench 20 ($2t_{ox}+W_{fp}$) is 0.4 μm and a case where the width of the trench 20 ($2t_{ox}+W_{fp}$) is 0.3 μm are illustrated, respectively. The breakdown voltage on any portion of the curves is made to be the same value.

As illustrated in FIG. 3, in the semiconductor device 100, impurity concentration $N_d$ of the drift layer 11 can be made higher by making the cell pitch smaller. For example, if cell pitch becomes below the range of 0.6 μm to 0.7 μm, the impurity concentration $N_d$ of the drift layer 11 can be made equal to or greater than $1 \times 10^{17}$ (atoms/cm$^3$). Thereby, the resistance $R_{dr}$ can be lowered further, while making the cell pitch fine.

However, if the impurity concentration of the drift layer 11 becomes excessive, in some cases, carriers are scattered by impurities to decrease the mobility of the drift layer 11 conversely. An example of the cases will be described below.

Figure 4:
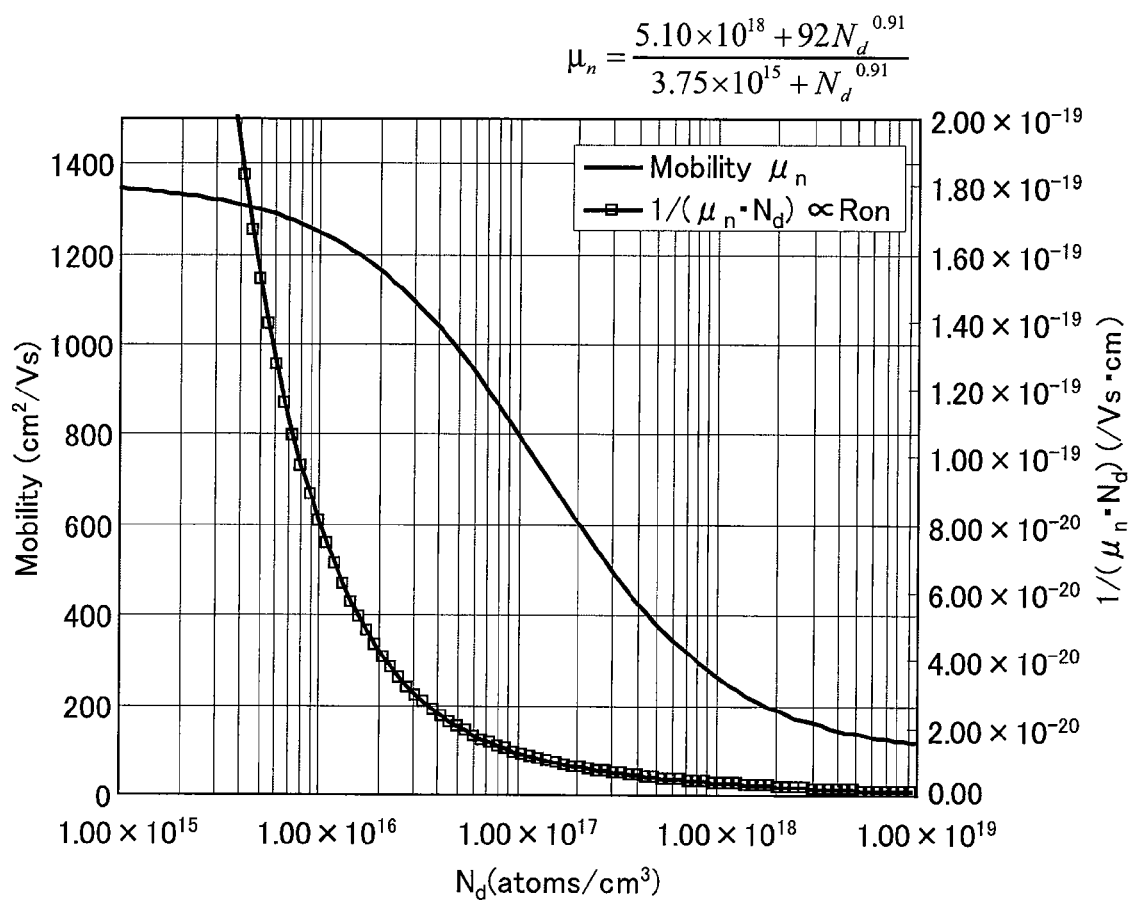
FIG. 4 is a graph illustrating the relationship between the impurity concentration and the mobility of the drift layer 11, and the relationship between the impurity concentration and the resistance of the drift layer 11.

FIG. 4 is a graph illustrating the relationship between the impurity concentration and the mobility of the drift layer 11, and the relationship between the impurity concentration and the resistance of the drift layer 11. The semiconductor material is silicon (Si). The transverse axis indicates the impurity concentration (atoms/cm$^3$) of the drift layer 11, the left vertical axis indicates the mobility (cm$^2$/V$_s$), and the right vertical axis indicates a value of ($1/(\mu_n \times N_d)$) which is proportional to the resistance $R_{dr}$.

As illustrated in FIG. 4, it is understood that if the impurity concentration of the drift layer 11 becomes higher than that of around $1 \times 10^{17}$ (atoms/cm$^3$), the mobility decreases. Accordingly, it is understood that if the impurity concentration of the drift layer 11 becomes higher than that of around $1 \times 10^{17}$ (atoms/cm$^3$), decrease of a value of ($1/(q \times \mu_n \times N_d)$) which is proportional to the resistance $R_{dr}$, saturates.

Figure 5:
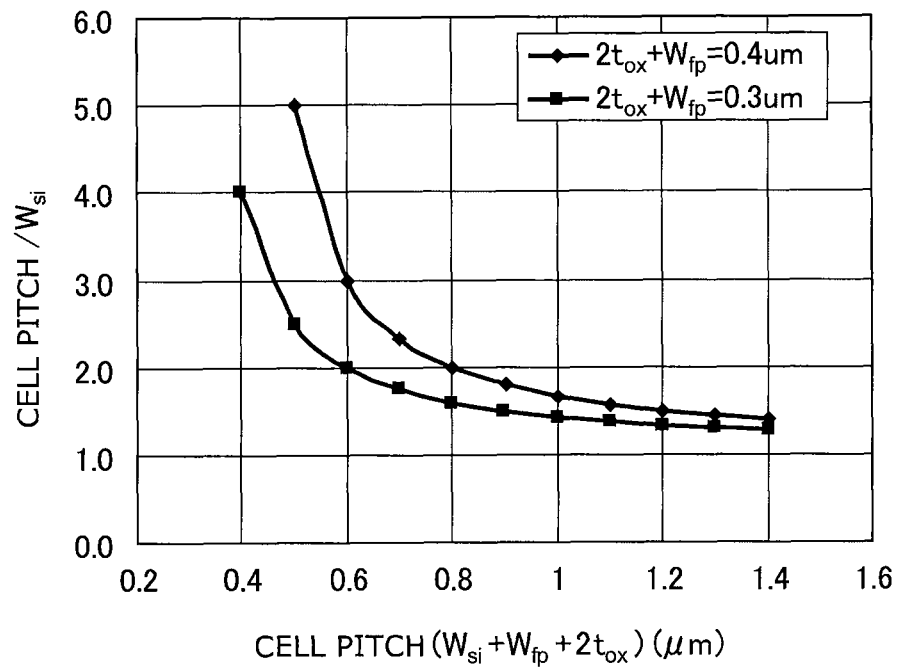
FIG. 5 is a graph illustrating the relationship between the cell pitch and the cell-pitch/drift-layer-width.

FIG. 5 is a graph illustrating the relationship between the cell pitch and the cell-pitch/drift-layer-width. The transverse axis indicates the cell pitch (($W_{si}+2t_{ox}+W_{fp}$) (μm), and the vertical axis indicates the cell-pitch/drift-layer-width (($W_{si}+2t_{ox}+W_{fp}$)/$W_{si}$). In FIG. 5, curves of a case where the width of the trench 20 ($2t_{ox}+W_{fp}$) is 0.4 μm and a case where the width of the trench 20 ($2t_{ox}+W_{fp}$) is 0.3 μm are illustrated, respectively.

As illustrated in FIG. 5, it is understood that if the cell pitch becomes below the range of 0.6 μm to 0.7 μm, the cell-pitch/drift-layer-width (($W_{si}+2t_{ox}+W_{fp}$)/$W_{si}$) increases. That is, it is understood that if the cell pitch becomes below the range of 0.6 μm to 0.7 μm, the value of (($W_{si}+2t_{ox}+W_{fp}$)/$W_{si}$) increases to increase the resistance $R_{dr}$ of formula (1). A specific example of this will be described below.

Figure 6:
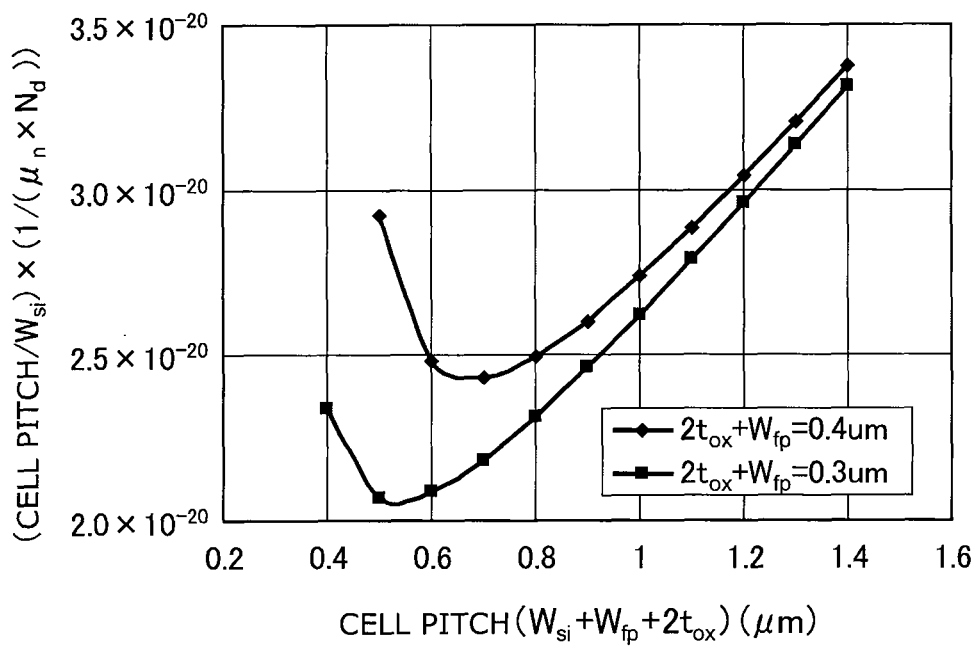
FIG. 6 is a graph illustrating the relationship between the cell pitch and the resistance of the drift layer 11.

FIG. 6 is a graph illustrating the relationship between the cell pitch and the resistance of the drift layer 11. The transverse axis indicates the cell pitch (($W_{si}+2t_{ox}+W_{fp}$) (μm), and the vertical axis indicates the value of (($W_{si}+2t_{ox}+W_{fp}$)/$W_{si}$)×($1/(\mu_n \times N_d)$) which is proportional to the resistance $R_{dr}$ of formula (1).

As illustrated in FIG. 6, it is understood that if the cell pitch becomes below the range of 0.6 μm to 0.7 μm, the value of (($W_{si}+2t_{ox}+W_{fp}$)/$W_{si}$)×($1/(\mu_n \times N_d)$) which is proportional to the resistance $R_{dr}$ increases.

Thus, it is understood that if the impurity concentration of the drift layer 11 has an upper limit of near $1 \times 10^{17}$ (atoms/cm$^3$). Moreover, it is understood that the cell pitch of the semiconductor device 100 has a lower limit of 0.6 μm and if the cell pitch becomes below the range of 0.6 μm, the resistance $R_{dr}$ increases.

On the other hand, in the semiconductor device 1 illustrated in FIG. 1, trenches 30 are further provided between the respective trenches 20, while setting the impurity concentration of the drift layer 11 to be a maximum value of around $1 \times 10^{17}$ (atoms/cm$^3$). The potentials of the gate electrodes 26 and 32 are equal to each other. Accordingly, when the semiconductor device 1 is switched on, if a voltage, equal to or greater than a threshold voltage, is applied to the gate electrode 26, a channel will be formed in a base region 12 facing the gate electrode 26 via the gate insulating film 25. Further, if a voltage, equal to or greater than a threshold voltage, is applied to the gate electrode 32, a channel will be formed in a base region 12 facing the gate electrode 32 via the gate insulating film 31. That is, in the semiconductor device 1, the channel density increases than that of the semiconductor device 100. Thereby, the on-resistance of the semiconductor device 1 decreases than that of the semiconductor device 100.

Moreover, when the semiconductor device 1 is switched off, as a result of presence of the field-plate electrode 22, even if space charges (positive charges) will be generated due to impurities contained in the drift layer 11, the space charges and negative charges induced on the surface of the field-plate electrode 22 cancel each other, and thereby a wide range of the drift layer 11 is depleted. Thereby, in the semiconductor device 1, depletion layers tend to extend toward the drift layer 11 from an interface between the trench 20 and the drift layer 11. The extended depletion layers connect to each other to deplete the entire drift layer 11. As a result, the semiconductor device 1 keeps its high breakdown voltage.

A method for manufacturing the semiconductor device 1 will be described.

Figure 7A:
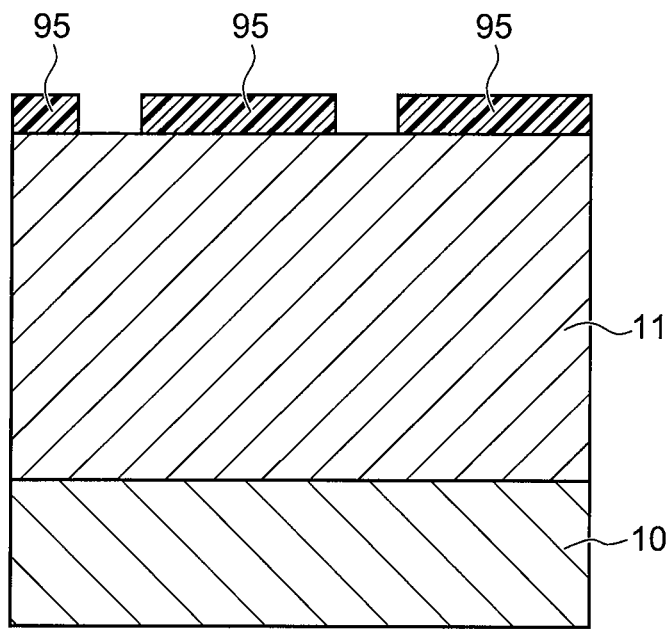
FIGS. 7A and 7B are schematic cross-sectional views of a main part each illustrating a manufacturing process of the semiconductor device.
Figure 7B:
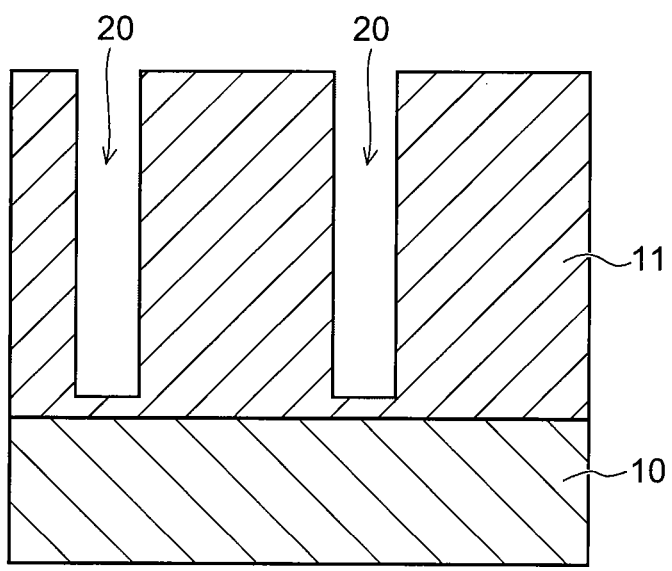

FIGS. 7A and 7B are schematic cross-sectional views of a main part each illustrating a manufacturing process of the semiconductor device. FIG. 7A illustrates a process of forming the drift layer, and FIG. 7B illustrates a process of forming the trenches.

First, as illustrated in FIG. 7A, a drain layer 10 is prepared, which is a semiconductor substrate, and a drift layer 11 is formed on the drain layer 10 by means of an epitaxial growth method. Subsequently, a mask 95 for forming trenches 20 is selectively formed on the drift layer.

Next, as illustrated in FIG. 7B, etching is performed on the drift layer 11 exposed by the mask 95. An example of the etching is a reactive-ion etching. By the process, the trenches 20 are selectively formed in the drift layer 11.

Figure 8A:
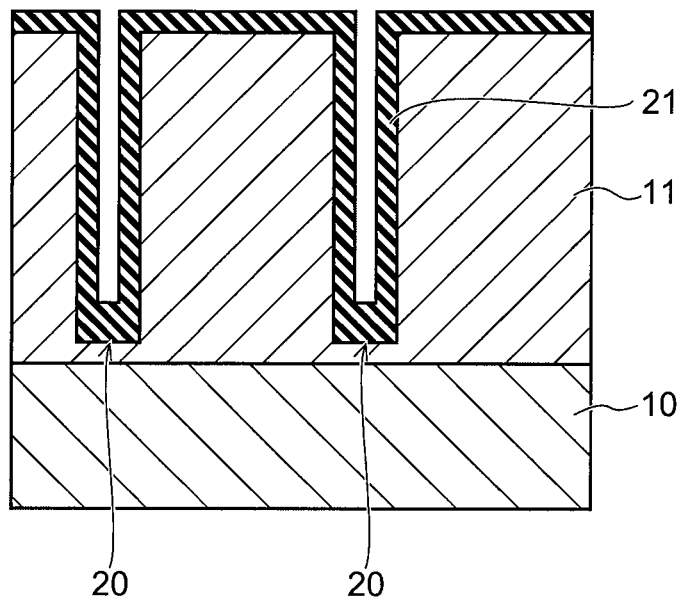
FIGS. 8A and 8B are schematic cross-sectional views of a main part each illustrating a manufacturing process of the semiconductor device.
Figure 8B:
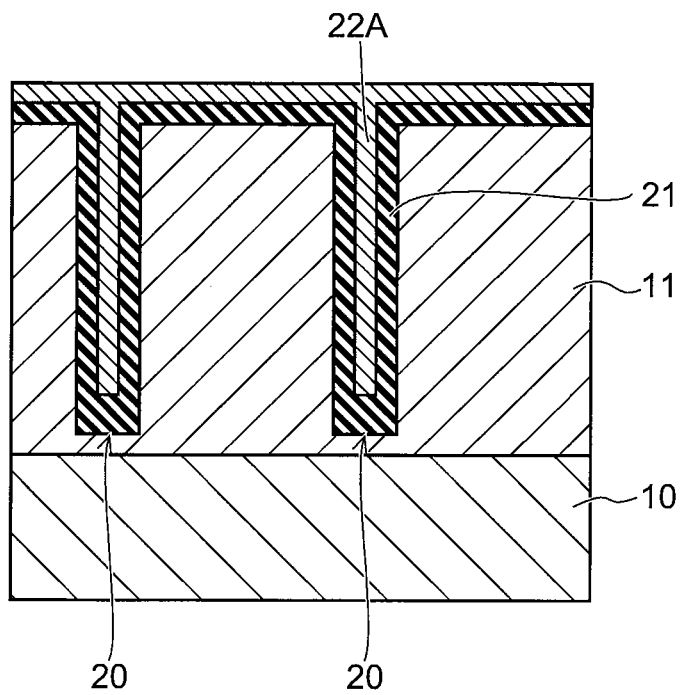

FIGS. 8A and 8B are schematic cross-sectional views of a main part each illustrating a manufacturing process of the semiconductor device. FIG. 8A illustrates a process of forming a field-plate insulating film, and FIG. 8B illustrates a process of forming a field-plate electrode.

Next, as illustrated in FIG. 8A, the inside of each of the trenches 20 is exposed to high temperature oxidizing atmosphere, and a field-plate insulating film 21 is formed on the inner wall of each of the trenches 20 and on the surface of the drift layer 11.

Next, as illustrated in FIG. 8B, a polysilicon layer 22A is formed in the trenches 20 via the field plate insulating film 21.

The formation of the polysilicon layer 22A is carried out by means of a CVD (Chemical Vapor Deposition) method, for example.

Figure 9A:
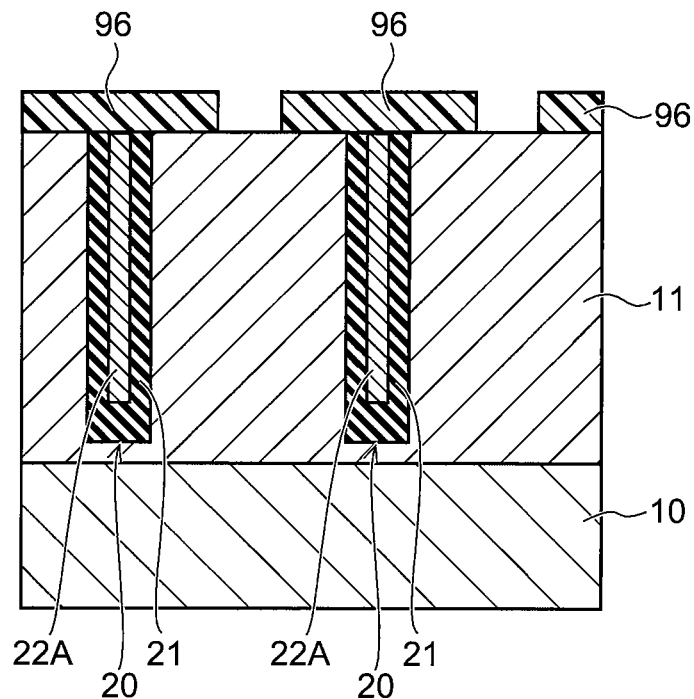
FIGS. 9A and 9B are schematic cross-sectional views of a main part each illustrating a manufacturing process of the semiconductor device.
Figure 9B:
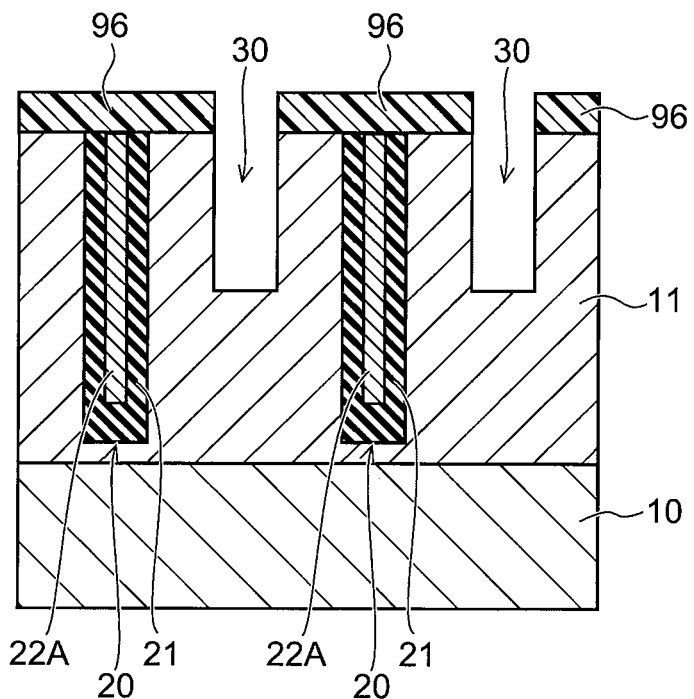

FIGS. 9A and 9B are schematic cross-sectional views of a main part each illustrating a manufacturing process of the semiconductor device. FIG. 9A illustrates a process of forming the mask, and FIG. 9B illustrates a process of forming the trenches.

Next, the field-plate insulating film 21 on the drift layer 11 and the polysilicon layer 22A on the drift layer 11 are etched. Then, as illustrated in FIG. 9A, a mask 96 for forming trenches 30 is selectively formed on the drift layer 11.

Next, as illustrated in FIG. 9B, etching is performed on the drift layer 11 exposed by the mask 96. An example of the etching is a reactive-ion etching. By the process, the trenches 30 are selectively formed in the drift layer 11. The trenches 30 are formed between the respective trenches 20. Then, the mask 96 is removed.

Figure 10A:
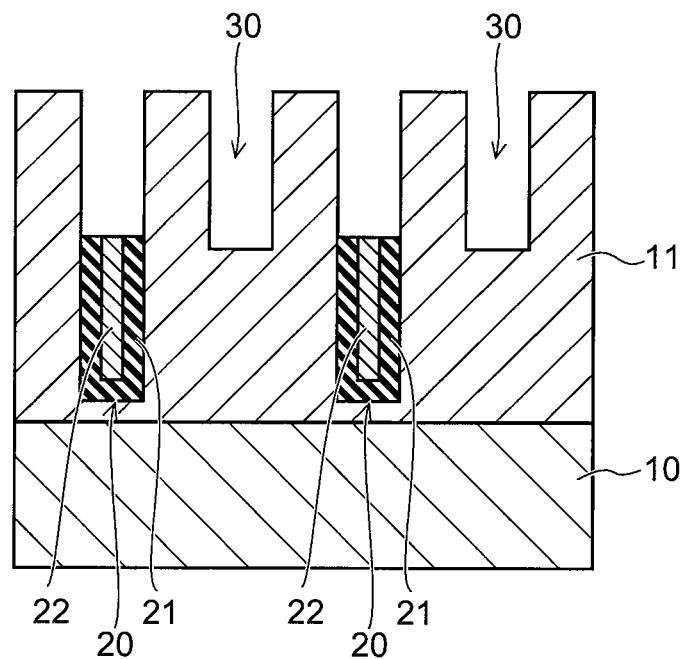
FIGS. 10A and 10B are schematic cross-sectional views of a main part each illustrating a manufacturing process of the semiconductor device.
Figure 10B:
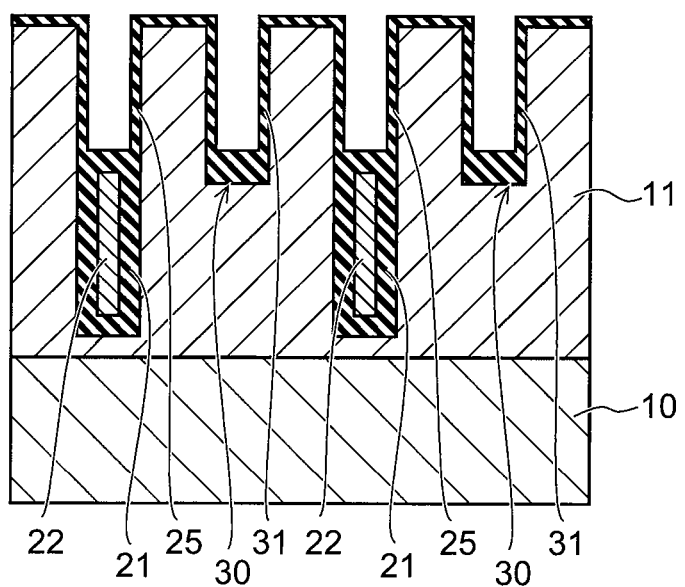

FIGS. 10A and 10B are schematic cross-sectional views of a main part each illustrating a manufacturing process of the semiconductor device. FIG. 10A illustrates a process of etching back, and FIG. 10B illustrates a process of forming a gate insulating film.

Next, as illustrated in FIG. 10A, the field-plate insulating film 21 and the polysilicon layer 22A in the trenches 20 are selectively etched-back. The etched-back depth in the trenches 20 is made substantially equal to that of the trenches 30. By this process, the field-plate electrodes 22 are formed under the respective trenches 20 via the field-plate insulating film 21.

Next, as illustrated in FIG. 10B, the inner walls of the trenches 30 and the trenches 20 and the upper ends of the field-plate electrodes 22 are exposed to a high temperature oxidizing atmosphere. By the process, a gate insulating film 25 is formed on the upper sides of the field-plate electrodes 22 and on the inner walls of the trenches 20, and a gate insulating film 31 is formed on the inner walls of the trenches 30.

Figure 11A:
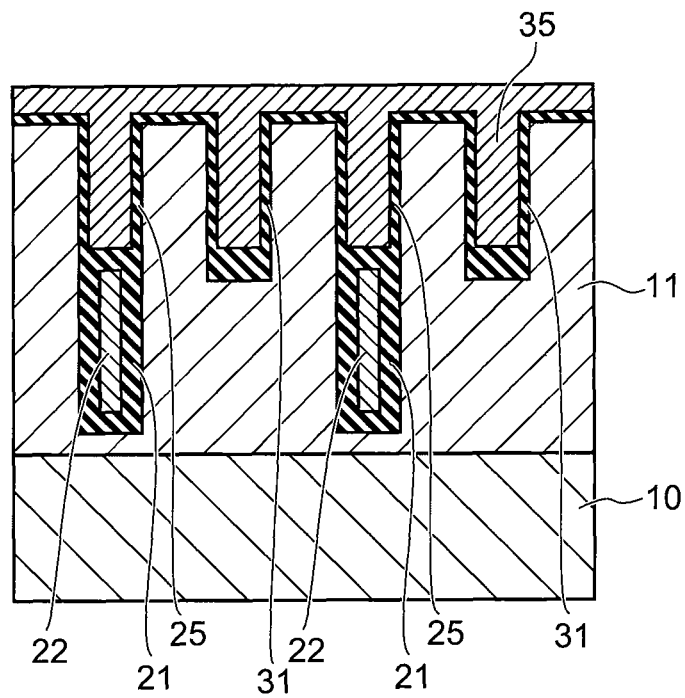
FIGS. 11A and 11B are schematic cross-sectional views of a main part each illustrating a manufacturing process of the semiconductor device.
Figure 11B:
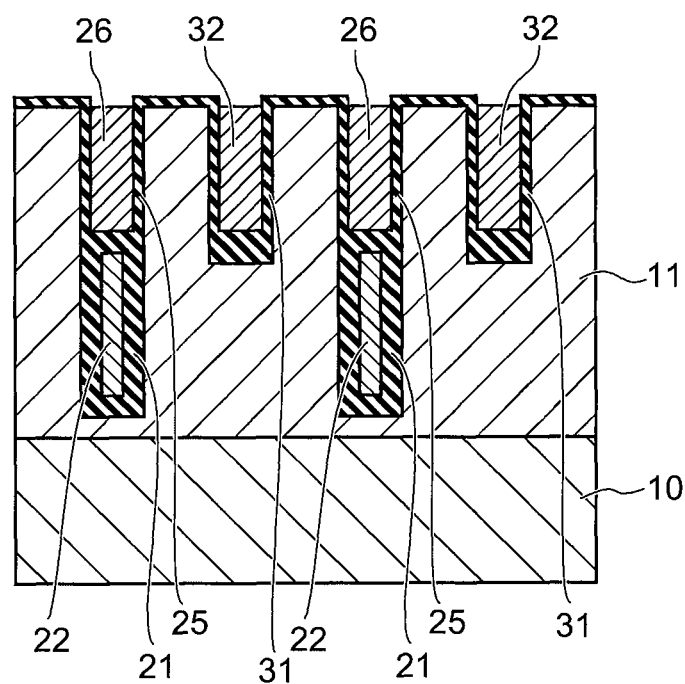

FIGS. 11A and 11B are schematic cross-sectional views of a main part each illustrating a manufacturing process of the semiconductor device. FIG. 11A illustrates a process of forming the gate electrode, and FIG. 11B illustrates an etching-back process.

Next, as illustrated in FIG. 11A, a polysilicon layer 35 is buried in trenches 20 and 30. Formation of the polysilicon layer 35 is carried out by means of a CVD method, for example. By the process, a gate electrode 26 is formed in each of the trenches 20 via the gate insulating film 25, and a gate electrode 32 is formed in each of the trenches 30 via the gate insulating film 31.

Next, as illustrated in FIG. 11B, an unnecessary part of the polysilicon layer formed on the trenches 20 and 30 and the drift layer 11 to remove the part are etched back. Etching-back of the unnecessary part of the polysilicon layer may be carried out by means of a CMP (Chemical Mechanical Polishing) method, for example. By the process, the gate electrodes 26, the field-plate electrodes 22, and the gate electrodes 32 are formed. After that, the gate insulating film 31 formed on the drift layer 11 is removed to expose the surface of the drift layer 11 (not illustrated in figures).

Figure 12A:
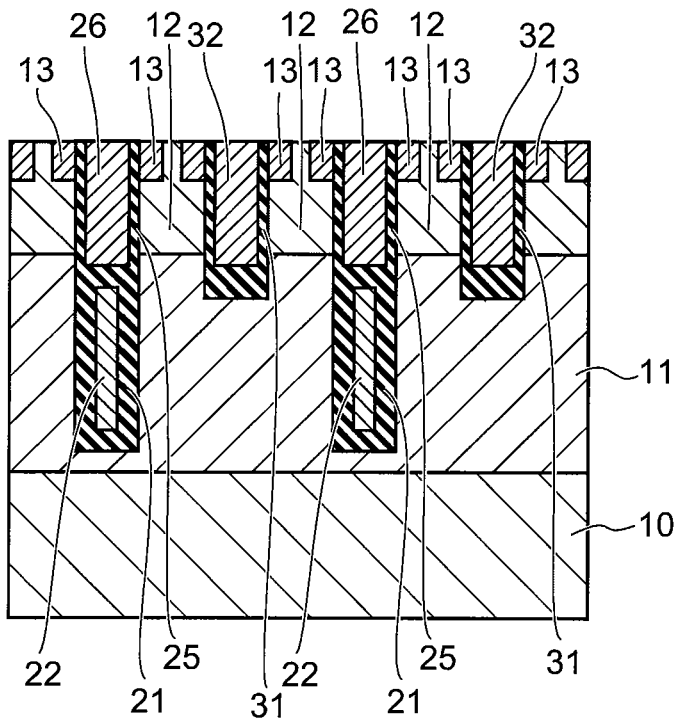
FIGS. 12A and 12B are schematic cross-sectional views of a main part each illustrating a manufacturing process of the semiconductor device.
Figure 12B:
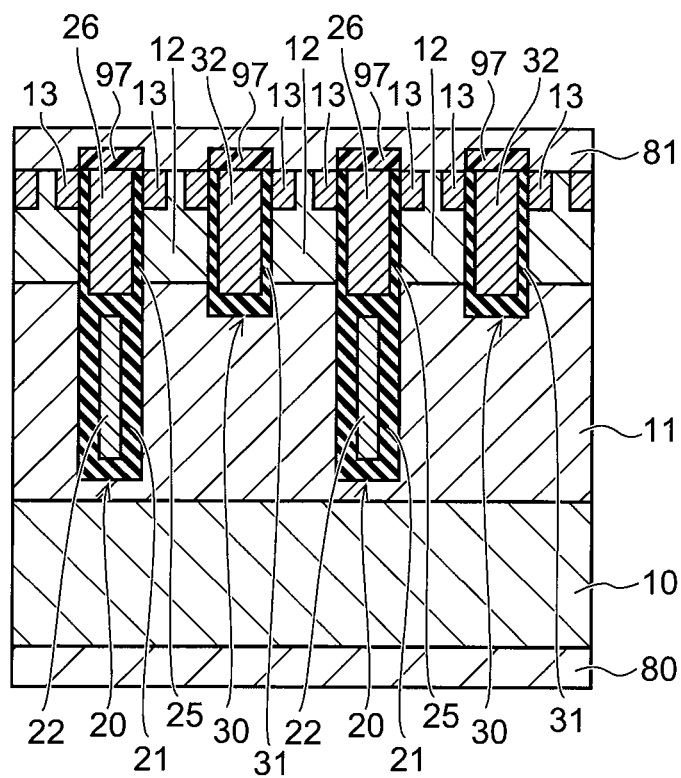

FIGS. 12A and 12B are schematic cross-sectional views of a main part each illustrating a manufacturing process of the semiconductor device. FIG. 12A illustrates a process of forming a base region and a source region, and FIG. 12B illustrates a process of forming an interlayer insulating film, a source electrode and a drain electrode.

Next, as illustrated in FIG. 12A, p-type impurities are introduced into the surface of the drift layer 11. By the process, the base region 12 is formed on the surface of the drift layer 11. At that time, the bottom surface of the base region 12 is adjusted so as to be upper than the lower ends of the gate electrodes 26 and 32. Subsequently, the source region 13 contacting the trenches 20 and 30 is selectively formed on the surface of the base regions 12.

Next, as illustrated in FIG. 12B, the interlayer insulating layer 97 above the gate electrodes 26 and 32 is formed. After that, the drain electrode 80 and the source electrode 81 are formed. By such manufacturing processes, the semiconductor device 1 illustrated in FIG. 1 is formed.

Next, other embodiments will be described. In the embodiments described below, members each having the same function of the corresponding member of the semiconductor device 1 are denoted by the same numerals, and detailed description of members described once is suitably omitted.

Second Embodiment

Figure 13A:
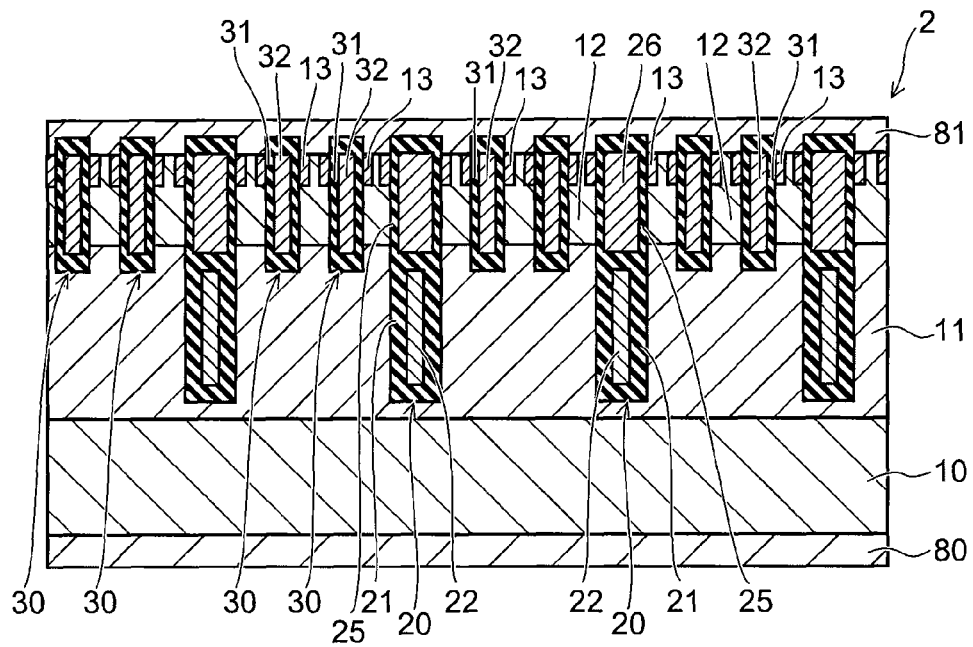
FIGS. 13A and 13B are schematic views of a main part each illustrating a semiconductor device according to a second embodiment.
Figure 13B:
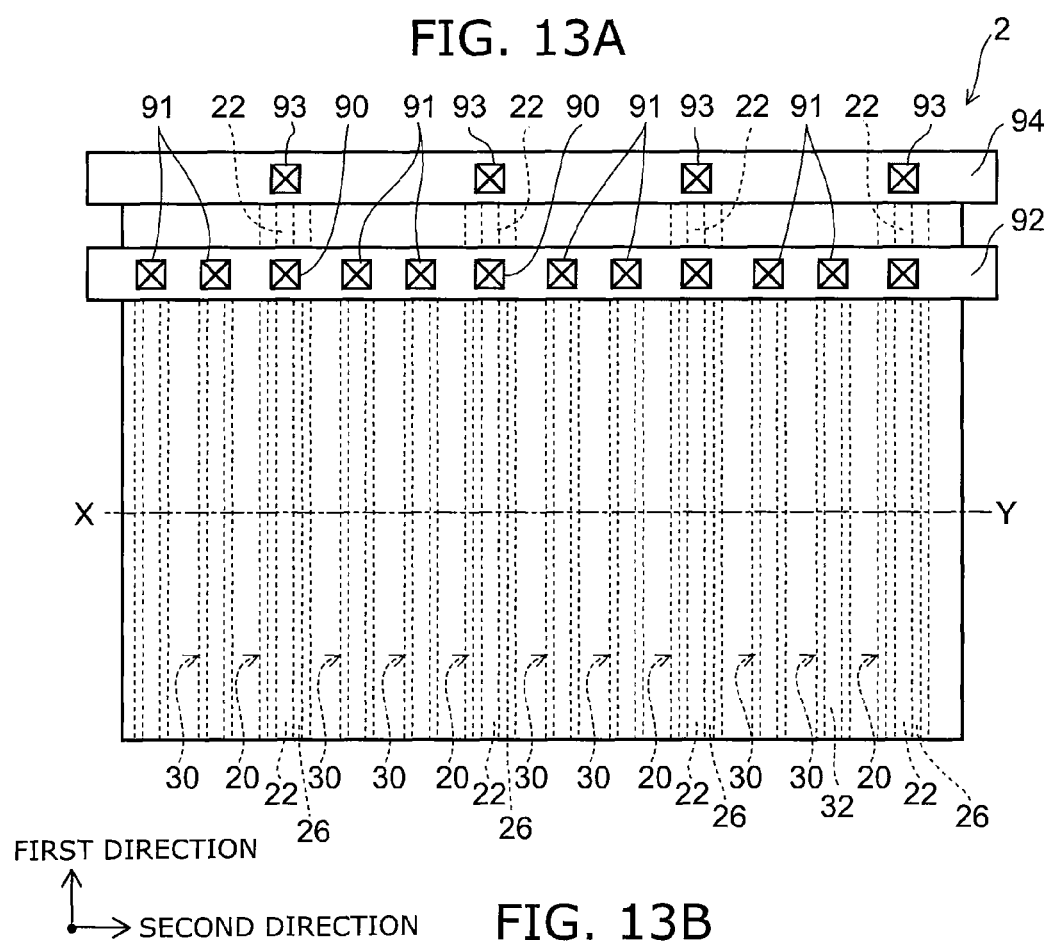

FIGS. 13A and 13B are schematic views of a main part each illustrating a semiconductor device according to a second embodiment. FIG. 13A is a schematic cross-sectional view of a main part of the device at X-Y position in FIG. 13B, and FIG. 13B is a schematic plane view of a main part of the device.

A semiconductor device 2 has the same basic configuration as that of the semiconductor device 1. However, in the semiconductor device 2, a plurality of trenches 30 are provided between the respective trenches 20. For example, in the semiconductor device 2, two trenches 30 are arranged between two neighboring trenches 20.

Gate electrodes 26, field-plate electrodes 22 below the gate electrodes 26 and the gate electrodes 32 neighboring to the gate electrodes 26 extend substantially in parallel with each other in a stripe-shape.

Each of the gate electrodes 26 is connected to a common gate wiring 92 via a gate contact 90 at the end thereof. Each of the gate electrodes 32 is connected to the gate wiring 92 via a gate contact 91 at the end thereof. Each of the field plate electrodes 22 is connected to a common field plate wiring 94 via a gate contact 93 at the end thereof.

When the semiconductor device 2 is switched on, if a voltage, equal to or greater than a threshold voltage, is applied to the gate electrode 26, a channel will be formed in a base region 12 facing the gate electrode 26 via a gate insulating film 25. Further, if a voltage, equal to or greater than a threshold voltage, is applied to the gate electrode 32, a channel will be formed in a base region 12 facing the gate electrode 32 via a gate insulating film 31. In the semiconductor device 2, since a plurality of trenches 30 are provided between the respective trenches 20, a channel density increases further than that of the semiconductor device 1. Thereby, the on-resistance of the semiconductor device 2 decreases further than that of the semiconductor device 1.

Third Embodiment

Figure 14A:
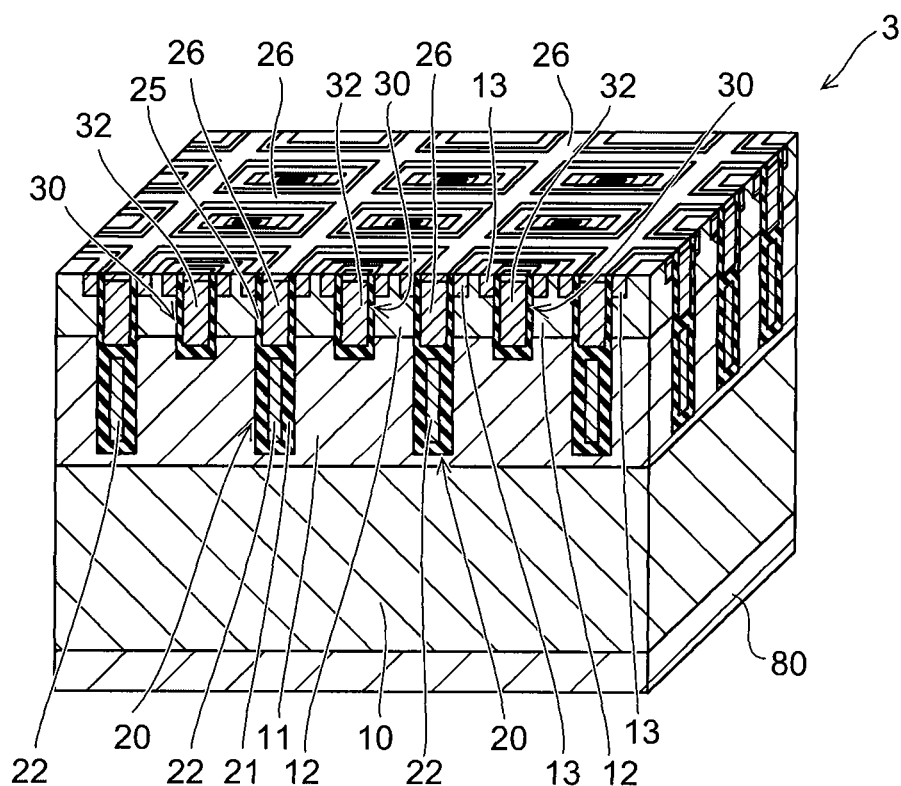
FIGS. 14A and 14B are schematic views of a main part each illustrating a semiconductor device according to a third embodiment.
Figure 14B:
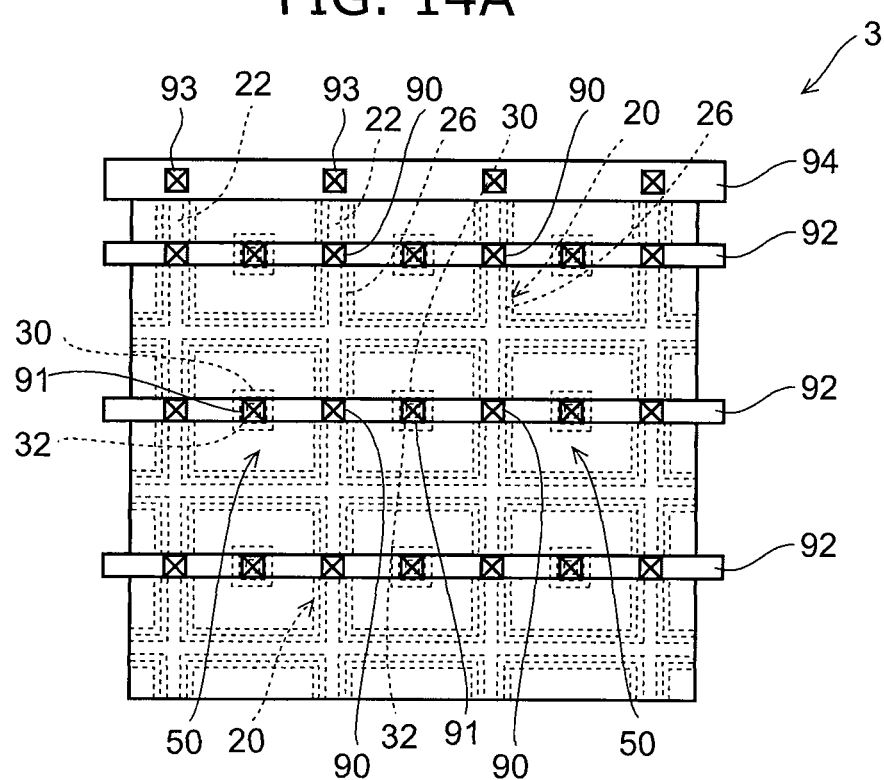

FIGS. 14A and 14B are schematic views of a main part each illustrating a semiconductor device according to a third embodiment. FIG. 14A is a schematic perspective view of a main part of the device, and FIG. 14B is a schematic plane view of a main part of the device. In FIG. 14A, a source electrode 81, a gate wiring 92 and a field-plate wiring 94 are not shown.

In a semiconductor device 3, a plurality of trenches 20 are provided, when viewed from a direction perpendicular to the main surface of the drift layer 11. Some of the plurality of trenches 20 extend in a first direction when viewed from a direction perpendicular to the main surface of the drift layer 11. Other some of the plurality of trenches 20 extend in a second direction substantially perpendicular to the first direction when viewed from a direction perpendicular to the main surface of the drift layer 11. The some of the plurality of trenches 20 and the other some of the plurality of trenches 20 cross each other. In this manner the trenches 20 communicate with each other in a mesh shape. Each trench 30 is surrounded by the some of the plurality of trenches 20 extending in the first direction and the other some of the plurality of trenches 20 extending in the second direction.

The shape of a region 50 surrounded by the mesh-like trenches 20 is a quadrangle, when viewed from a direction perpendicular to the main surface of the drift layer 11. Other cases where the shape of the region 50 is a triangle, a hexagon and a circle, respectively, are also included in the embodiment. The gate electrodes 26 provided in the trenches 20 communicate each other in a mesh shape, when viewed from a direction perpendicular to the main surface of the drift layer 11. For example, the gate electrodes 26 communicate each other in the first direction and the second direction substantially perpendicular to the first direction, when viewed from a direction perpendicular to the main surface of the drift layer 11.

The pitches of the mesh are the same as those of the trenches 20 of the semiconductor device 1. That is, the pitches of the trenches 20 running in a matrix in a plane are the same as those of the trenches 20 of the semiconductor device 1. The field-plate electrodes 22 provided below the corresponding gate electrodes 26, when viewed from a direction perpendicular to the main surface of the drift layer 11, also communicate each other in a mesh shape (not shown).

In the semiconductor device 3, the trenches 30 are arranged in corresponding regions each surrounded by the mesh-like trenches 20, when viewed from a direction perpendicular to the main surface of the drift layer 11. A gate electrode 32 is provided in each of the trenches 30.

At ends of the semiconductor device 3, each of the gate electrodes 26 communicating each other in a mesh shape is connected to a common gate wiring 92 via a gate contact 90. Each of the gate electrodes 32 is connected to the common gate wiring 92 via a gate contact 91. Each of the field plate electrodes 22 is connected to a common field plate wiring 94 via a gate contact 93 at the end thereof.

When the semiconductor device 3 is switched on, if a voltage, equal to or greater than a threshold voltage, is applied to the gate electrode 26, a channel will be formed in a base region 12 facing the gate electrode 26 via a gate insulating film 25. Further, if a voltage, equal to or greater than a threshold voltage, is applied to the gate electrode 32, a channel will be formed in a base region 12 facing the gate electrode 32 via a gate insulating film 31. In the semiconductor device 3, the trenches 20 are provided in a mesh shape, the channel density increases further than that of the semiconductor device 1. Thereby, the on-resistance of the semiconductor device 3 decreases further than that of the semiconductor device 1. Moreover, by arranging the plurality of trenches 30 in the corresponding areas each surrounded by the trenches 20 (not shown in figures), the on-resistance of the semiconductor device 3 decreases further.

Fourth Embodiment

Figure 15A:
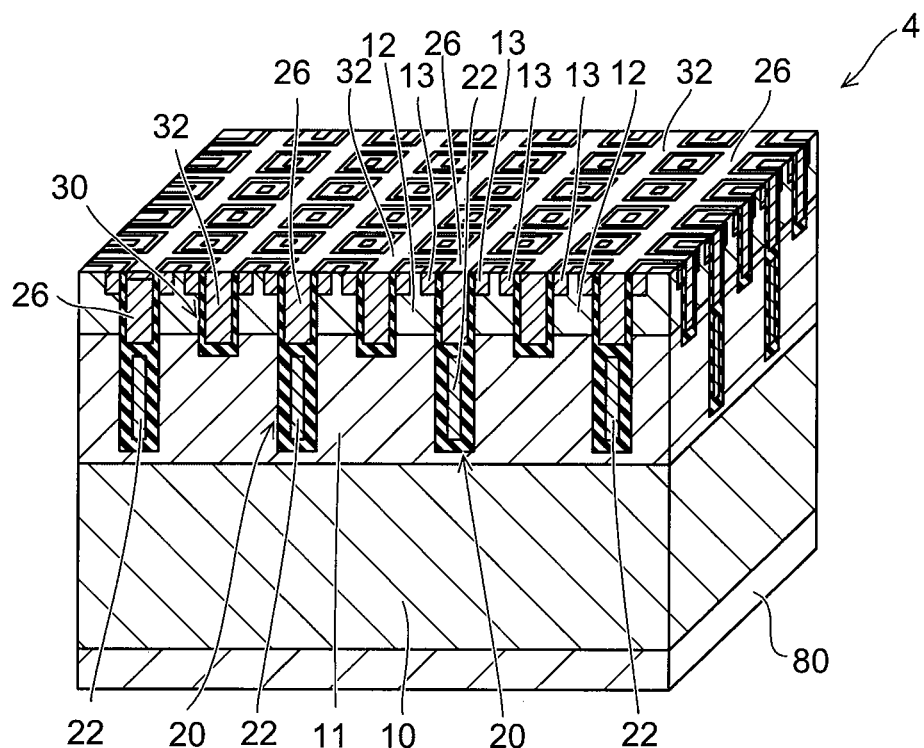
FIGS. 15A and 15B are schematic views of a main part illustrating a semiconductor device according to a fourth embodiment, respectively.
Figure 15B:
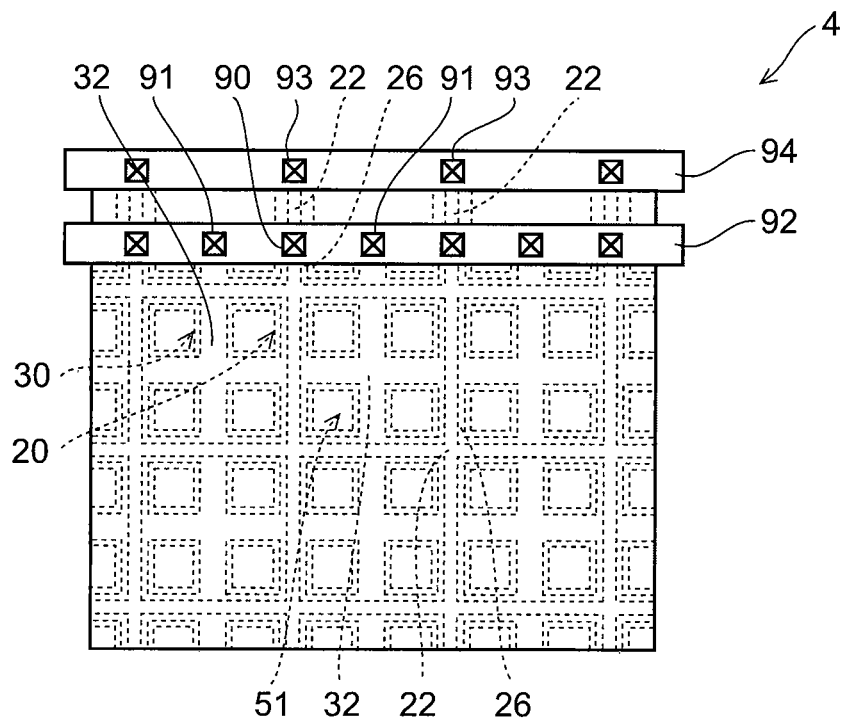

FIGS. 15A and 15B are schematic views of a main part illustrating a semiconductor device according to a fourth embodiment, respectively. FIG. 15A is a schematic perspective view of a main part of the device, and FIG. 15B is a schematic plane view of a main part of the device. A source electrode 81 is not shown in FIG. 15A.

In a semiconductor device 4, when viewed from a direction perpendicular to the main surface of the drift layer 11, a plurality of trenches 30 are provided. Some of the plurality of second trenches extend in a first direction, and other some of the plurality of trenches extend in a second direction substantially perpendicular to the first direction. The some of the plurality of trenches 30 and the other some of the plurality of trenches 30 cross each other. Further, the some of the plurality of trenches 30 and the other some of the plurality of trenches 20 cross each other, and the other some of the plurality of trenches 30 and some of the plurality of trenches 20 cross each other. That is, the trenches 30 extending in the first direction and the trenches 20 extending in the second direction cross each other, and the trenches 30 extending in the second direction and the trenches 20 extending in the first direction cross each other.

The shape of the region 51 surrounded by the mesh-like trenches 20 and 30, when viewed from a direction perpendicular to the main surface of the drift layer 11, is a quadrangle. Other cases where the shape of the areas 51 is a triangle, a hexagon and a circle, respectively, are also included in the embodiment. The gate electrodes 26 and the gate electrodes 32 communicate with each other in a mesh shape, when viewed from the same direction, is a quadrangle. For example, the gate electrodes 26 and the gate electrodes 32 communicates with each other in first and second directions, when viewed from the same direction. The pitches of the trenches 20 running in a matrix in a plane, when viewed from the same direction, are the same as those of the trenches 20 in the semiconductor device 1. The field-plate electrodes 22 provided below each of the gate electrodes 26, when viewed from the same direction, also communicate each other in a mesh shape (not shown).

At ends of the semiconductor device 4, each of the gate electrodes 26 communicating each other in a mesh shape is connected to a common gate wiring 92 via a gate contact 90. Each of the field plate electrodes 22 is connected to a common field plate wiring 94 via a gate contact 93 at the end thereof.

When the semiconductor device 4 is switched on, if a voltage, equal to or greater than a threshold voltage, is applied to the gate electrode 26, a channel will be formed in a base region 12 facing the gate electrode 26 via a gate insulating film 25. Further, if a voltage, equal to or greater than a threshold voltage, is applied to the gate electrode 32, a channel will be formed in a base region 12 facing the gate electrode 32 via a gate insulating film 31. In the semiconductor device 4, the trenches 20 and 30 are provided in a mesh shape, the channel density increases further than that of the semiconductor device 3. Thereby, the on-resistance of the semiconductor device 4 decreases further than that of the semiconductor device 3.

Moreover, like in the semiconductor device 2, by arranging a plurality of trenches 30 between the respective trenches 20 (not shown in figures), the on-resistance of the semiconductor device 4 decreases further. Moreover, with such a structure, the structure of a gate wiring becomes simpler than that of the semiconductor device 3.

In the third and fourth embodiments, when the main surface of the drain layer 10 (that is a semiconductor substrate) is a (1 0 0) plane, by making the planar shape of the regions 50 and 51 (when viewed from a direction perpendicular to the main surface of the drift layer 11) be a quadrangle, for example, four equivalent {1 0 0} planes can be used as channel surfaces. Moreover, when the main surface of the drain layer 10 is a (1 1 1) plane, by making the planar shape of the regions 50 and 51 be a triangle, three equivalent planes constitute channel surfaces. When the regions 50 and 51 with the planar shape of a triangles or a quadrangle are used, local electric field concentration may be generated at corners of the trenches, however, in such cases, by making the planar shape be a hexagon or a circle, the electric field concentration is relaxed, thereby, enabling the breakdown voltage of the gate oxide film 31 to be improved further.

Fifth Embodiment

Figure 16A:
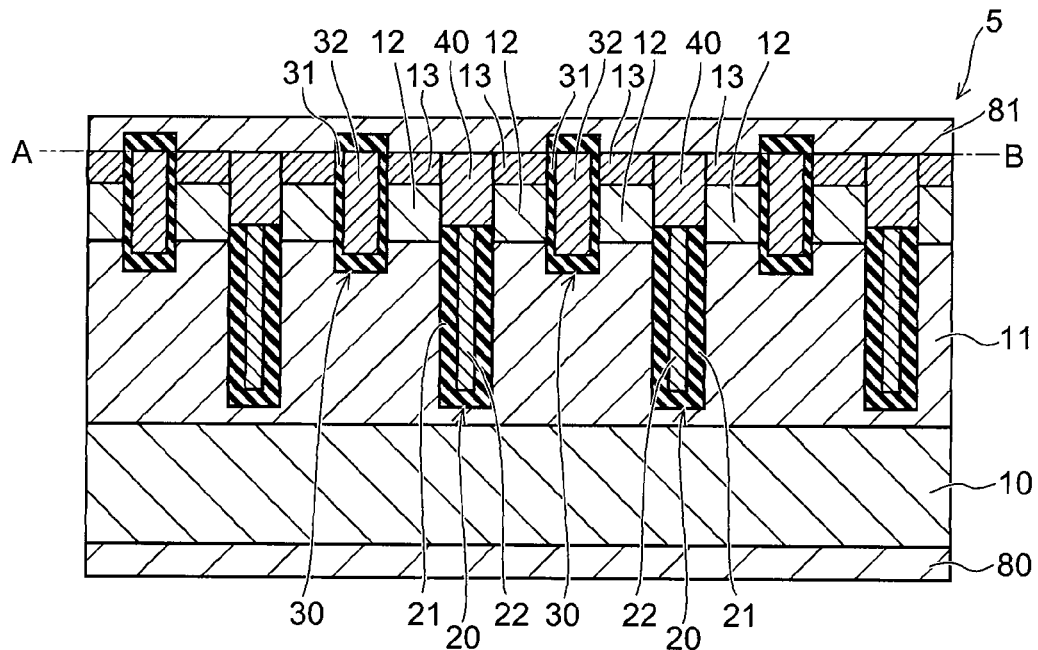
FIGS. 16A and 16B are schematic views of a main part of a semiconductor device according to the fifth embodiment, respectively.
Figure 16B:
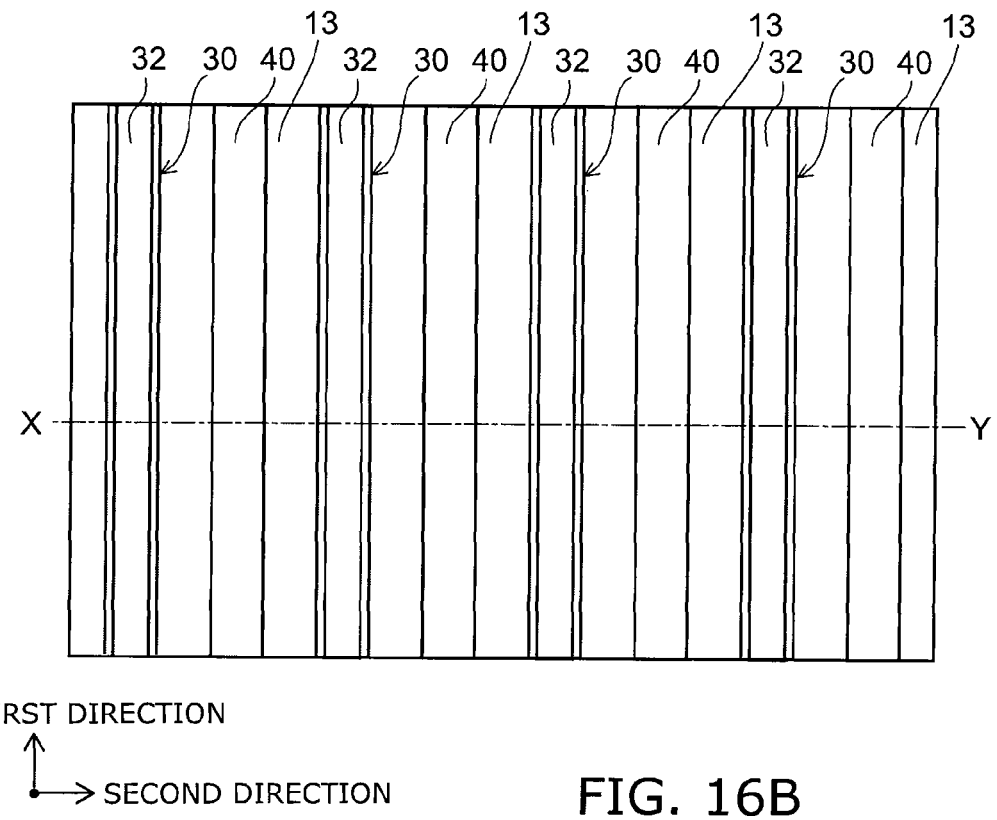

FIGS. 16A and 16B are schematic views of a main part of a semiconductor device according to the fifth embodiment, respectively. FIG. 16A is a schematic cross-sectional view of a main part of the device at X-Y position in FIG. 16B, and FIG. 16B is a schematic plane view of a cut surface of a main part of the device along line A-B in FIG. 16A when viewed from above.

The semiconductor device 5 is a power MOSFET with an upper and lower electrode structure, and as illustrated in FIG. 16A, it is provided with a drain layer 10, a drift layer 11 provided on the drain layer 10, and a p-type conductivity base region 12 provided on the drift layer 11. On the surface of the base region 12, a source region 13 is provided.

In the semiconductor device 5, a plurality of trenches 20 each contacting the drift layer 11 while penetrating through the base region 12 from the source of the source region 13 are provided. The trenches 20 are in contact with the drift layer 11. At the lower side in each of the trenches 20, a field-plate electrode 22 is provided via a field-plate insulating film 21. On the field plate electrode 22, a contact region 40 is provided. The lower end of the contact region 40 is located at a position lower than that of the base region 12. The contact region 40 is connected to the field plate electrode 22.

Between the respective trenches 20, a trench 30 contacting the drift layer 11 while penetrating through the base region 12 from the surface of the source region 13 is provided. A gate electrode 32 is provided in each of the trenches 30 via the gate insulating film 31. The lower ends of the trenches 30 are located at a position shallower than that of the trenches 20. The trenches 20 and the trenches 30 are arranged alternately in a direction substantially in parallel with the surface of the base region 12.

The drain layer 10 is connected to a drain electrode 80. A source electrode 81 is connected to the source region 13 and the base region 12.

As illustrated in FIG. 16B, when viewed from a direction perpendicular to the main surface of the drift layer 11, the trenches 20 and the trenches 30 extend substantially in parallel with each other. As a result, the contact regions 40, the field-plate electrodes 22 below the contact regions 40 and the gate electrodes 32 extend substantially in parallel with each other in a stripe-shape.

Each of the gate electrodes 32 is connected to the common gate wiring 92 via a gate contact 91 at the end thereof. Each of the field plate electrodes 22 (contact regions 40) is connected to a common field plate wiring 94 via a gate contact 93 at the end thereof.

The lower limit of pitches of the trenches is 0.6 μm (micron), for example. Impurity concentration of the drift layer 11 is designed to be equal to or smaller than $1 \times 10^{17}$ (atoms/cm$^3$), when the pitches of the trenches 20 are set to be 0.6 μm. The minimum value of the pitches of the trenches is 0.6 μm. The maximum value of the impurity concentration of the drift layer 11 is $1 \times 10^{17}$ (atoms/cm$^3$). In the semiconductor device 5, trenches 30 are further provided in the drift layer 11 between two of the trenches 20 with this pitch.

The materials of the contact region 40 are aluminum (Al), copper (Cu), tungsten (W), polysilicon, etc., for example.

When the semiconductor device 5 is switched on, if a voltage, equal to or greater than a threshold voltage, is applied to the gate electrode 32, a channel will be formed in a base region 12 facing the gate electrode 32 via a gate insulating film 31.

Moreover, when the semiconductor device 5 is switched off, as a result of formation of the field-plate electrode 22, even if space charges (positive charges) will be generated due to impurities contained in the drift layer 11, the space charges and negative charges induced on the surface of the field-plate electrode 22 cancel each other, and thereby, a wide range of the drift layer 11 is depleted. Thereby, in the semiconductor device 5, a depletion layer tends to extend toward the drift layer 11 from an interface between each of the trenches 20 and the drift layer 11. The extended depletion layers connect to each other to deplete the entire drift layer 11. As a result, even if the impurity concentration of the drift layer 11 is set to be high, the semiconductor device 5 keeps its high breakdown voltage.

Moreover, according to the semiconductor device 5, carriers generated at the time of the avalanche breakdown of the semiconductor device 5 can be efficiently drawn out via the contact regions 40.

Moreover, according to the semiconductor device 5, since each of the field plate-electrodes 22 is connected to one of the contact regions 40, it is not necessary to draw a wiring for electrically connecting the field-plate electrodes 22 to the source electrode 81.

In addition, in the semiconductor device 5, an embodiment, in which a plurality of trenches 30 are provided between the respective trenches 20 like the embodiment in FIG. 13, is also included.

Sixth Embodiment

Figure 17A:
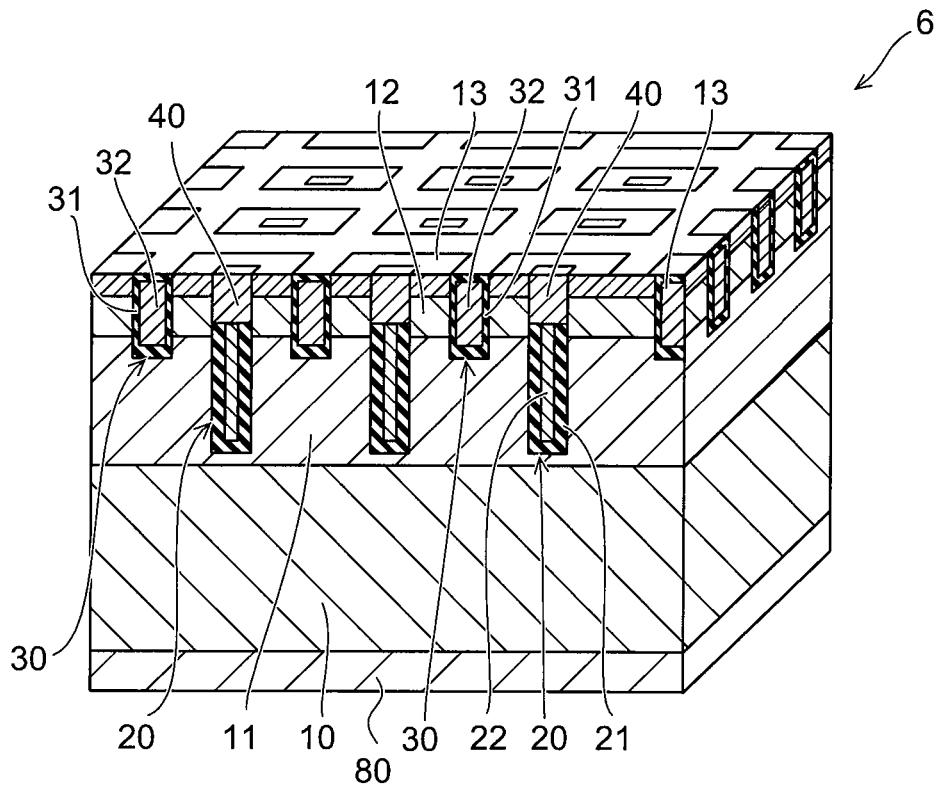
FIGS. 17A and 17B are schematic views of a main part each illustrating a semiconductor device according to a sixth embodiment.
Figure 17B:
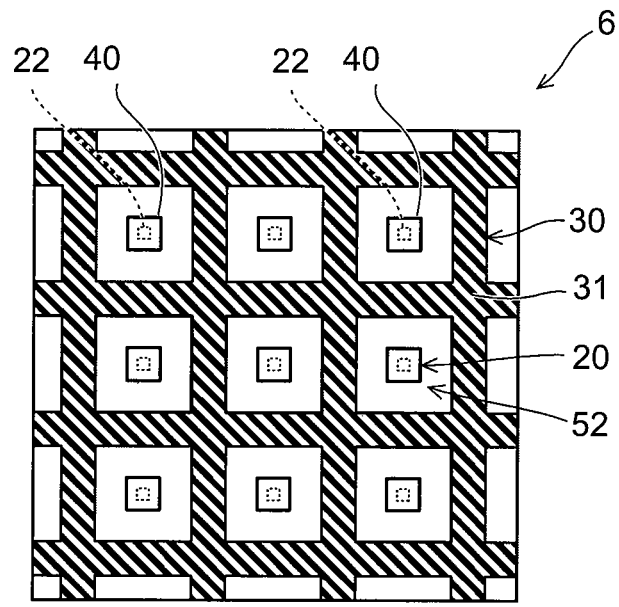

FIGS. 17A and 17B are schematic views of a main part each illustrating a semiconductor device according to a sixth embodiment. FIG. 17A is a schematic perspective view of a main part of the device, and FIG. 17B is a schematic plane view of a main part of the device. A source electrode 81 is not shown in FIG. 17A.

In a semiconductor device 6, some of a plurality of trenches 30 extend in a first direction, when viewed from a direction perpendicular to the main surface of the drift layer 11. Other of the plurality of trenches 30 extend in a second direction substantially perpendicular to the first direction, when viewed from the direction perpendicular to the main surface of the drift layer 11. The some of the plurality of trenches 30 and the other some of the plurality of trenches 20 cross each other. In this manner the trenches 30 communicate with each other in a mesh shape. Each of the trenches 20 is surrounded by the some of the plurality of trenches 30 extending in the first direction and the other some of the plurality of trenches 30 extending in the second direction.

The shape of region 52 surrounded by the mesh-like trenches 30 is a quadrangle, viewed from a direction perpendicular to the main surface of the drift layer 11. Other cases where the shape of the region 52 is a triangle, a hexagon and a circle, respectively, are also included in the embodiment. The region 52 is arranged in a grid, when viewed from the direction perpendicular to the main surface of the drift layer 11. One trench 20 is provided in each of the regions 52. Pitches of the trenches 20 running in a matrix in a plane are the same as those of the trenches 20 in the semiconductor device 5.

A field plate electrode 22 is connected to a gate electrode 26 in each of the trenches 20. The gate electrodes 32 provided in the trenches 20 communicate each other in a mesh shape, viewed from a direction perpendicular to the main surface of the drift layer 11. For example, the gate electrodes 32 communicate each other in a first direction and a second direction substantially perpendicular to the first direction, viewed from the direction perpendicular to the main surface of the drift layer 11.

When the semiconductor device 6 is switched on, if a voltage, equal to or greater than a threshold voltage, is applied to the gate electrode 32, a channel will be formed in a base region 12 facing the gate electrode 32 via a gate insulating film 31. In the semiconductor device 6, since the trenches 30 are provided in a mesh shape, the channel density increases further than that of the semiconductor device 5. Thereby, the on-resistance of the semiconductor device 6 decreases further than that of the semiconductor device 5.

Moreover, according to the semiconductor device 6, each of the field plate electrodes 22 is electrically connected to the source electrode 81 via a contact region 40, thereby, the capacity between the gate and the drain of the semiconductor device 6 decreases. Thus, switching characteristics of the semiconductor device 6 is improved. Since each of the field plate-electrodes 22 are connected to one of the contact regions 40, it is not necessary to draw a wiring for electrically connecting the field-plate electrodes 22 to the source electrode 81 in the semiconductor device 6.

Seventh Embodiment

FIGS. 18A to 18D are schematic plan views of a main part illustrating a semiconductor device according to a seventh embodiment, respectively. FIGS. 18A to 18D are plan views of first to fourth examples, respectively.

The trenches 20 and 30 of the semiconductor devices illustrated in FIGS. 1A and 16A, may be modified to have the following planar shapes, respectively.

Figure 18A:
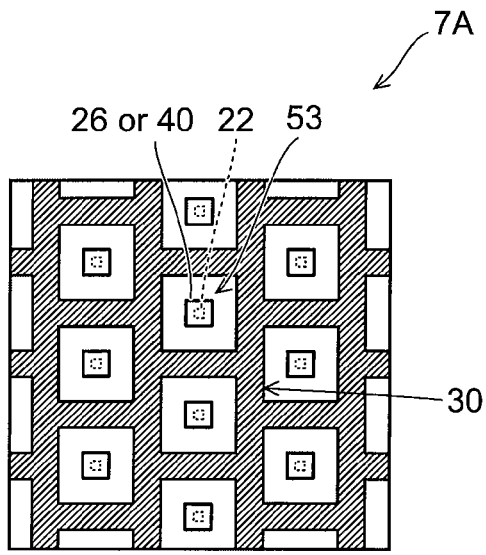
FIGS. 18A to 18D are schematic plan views of a main part illustrating a semiconductor device according to a seventh embodiment, respectively.

In a semiconductor device 7A illustrated in FIG. 18A, planar shape of regions 53 each surrounded by the trenches 30 is a quadrangle. In regions except for the regions 53, when viewed from a direction perpendicular to the main surface of the drift layer 11, the trenches 30 are arranged in a mesh shape. In the mesh-like trenches 30, gate electrodes 32 are two-dimensionally arranged so as to be along with the mesh.

The regions surrounded by the trenches 30 are periodically arranged in a first direction. However, if a second direction is indicated by columns, pitches of the regions 53 in the first direction have phases shifting by 180° by one column, respectively.

Figure 18B:
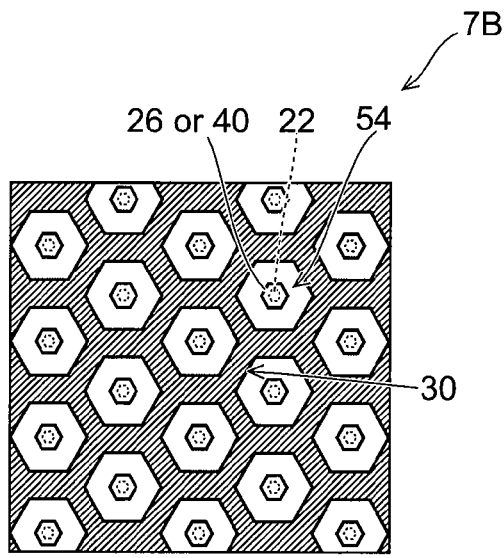

In a semiconductor device 7B illustrated in FIG. 18B, planar shape of regions 54 each surrounded by the trenches 30 is a hexagon. In regions except for the regions 54, when viewed from a direction perpendicular to the main surface of the drift layer 11, the trenches 30 are arranged in a mesh shape. In the mesh-like trenches 30, gate electrodes 32 are two-dimensionally arranged so as to be along with the mesh. The regions 54 surrounded by the trenches 30 are periodically arranged in a first direction. However, pitches of the regions 54 in the first direction have phases shifting by 180° by one column, respectively.

Figure 18C:
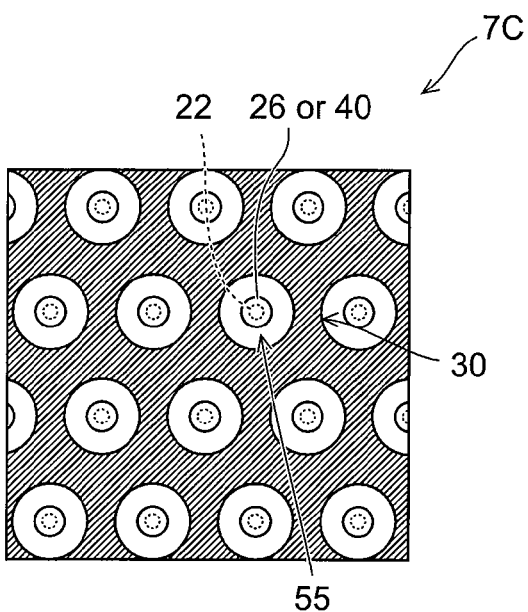

In a semiconductor device 7C illustrated in FIG. 18C, planar shape of regions 55 each surrounded by the trenches 30 is a circle. In regions except for the regions 55, when viewed from a direction perpendicular to the main surface of the drift layer 11, the trenches 30 are arranged in a mesh shape. In the mesh-like trenches 30, gate electrodes 32 are two-dimensionally arranged so as to be along with the mesh. The regions 55 surrounded by the trenches 30 are periodically arranged in a second direction. However, pitches of the regions 55 in the second direction have phases shifting by 180° by one column, respectively.

Figure 18D:
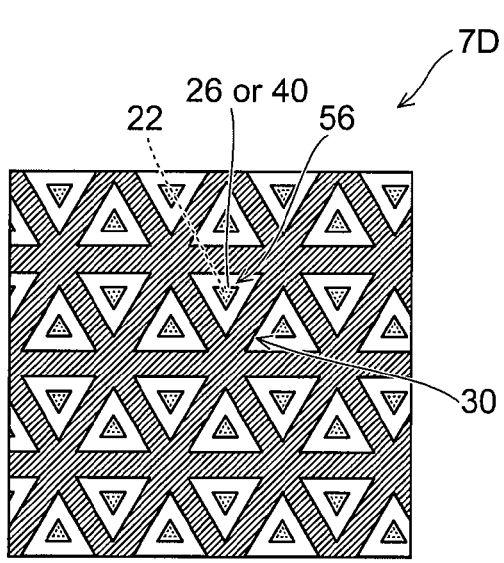

In a semiconductor device 7D illustrated in FIG. 18D, planar shape of regions 56 each surrounded by the trenches 30 is a triangle. In areas except for the regions 56, when viewed from a direction perpendicular to the main surface of the drift layer 11, the trenches 30 are arranged in a mesh shape. In the mesh-like trenches 30, gate electrodes 32 are two-dimensionally arranged so as to be along with the mesh. Sides of the triangle regions 56 facing each other are substantially in parallel each other, and facing distances are substantially equal. Center of each of the regions 56 is located at an intersection point of a honeycomb shape.

Thus, since the planar shape of areas surrounded by the trenches 30 is one of a triangle, a quadrangle, a hexagon, and a circle, the planar shape of the gate electrodes, viewed from a direction perpendicular to the main surface of the drift layer 11, becomes one of a triangle, a quadrangle, a hexagon, and a circle. Alternatively, the shape of channel regions facing the respective gate electrodes 32 via respective gate insulating films 31, when viewed from the direction perpendicular to the main surface of the drift layer 11, becomes one of a triangle, a quadrangle, a hexagon, and a circle. Such semiconductor devices 7A to 7D are also included in the embodiment.

As a result, in the semiconductor devices 7A to 7D, when the main surface of the drain layer 10 (that is a semiconductor substrate) is a (1 0 0) plane, by making planar shape of the regions 52 and 53 (viewed from a direction perpendicular to the main surface of the drift layer 11) be a quadrangle, for example, four equivalent {1 0 0} planes can be used as channel surfaces. Moreover, when the main surface of the drain layer 10 is a (1 1 1) plane, by making the planar shapes of the regions 56 be a triangle, three equivalent planes constitute channel surfaces. When the regions 52, 53 and 56 with the planar shape of a triangle or a quadrangle are used, local electric field concentration may be generated at corners of the trenches, however, in such cases, by making the planar shapes be hexagons or circles like the regions 54 and 55, the electric field concentration is relaxed, thereby, enabling the withstanding voltage of the gate oxide film 31 to be improved further.

As above, with reference to specific examples, the embodiments have been described. However, the embodiments are not limited to the specific examples. That is, ones made by adding any design change to the specific examples by those skilled in the art are also included within the scope of the embodiments, as along as they have aspects of the embodiments. Further, elements and their arrangement, materials, conditions, shapes, and sizes etc., are not limited to exemplified ones, they also can be suitably changed. Moreover, exemplified figures and their descriptions are not independent ones, they can be suitably combined.

Furthermore, various modifications and alterations within the spirit of the invention will be readily apparent to those skilled in the art. All such modifications and alterations should therefore be seen as within the scope of the invention.

What is claimed is:

1. A semiconductor device comprising:
a drain layer of a first conductivity type;
a drift layer of the first conductivity type provided on the drain layer;
a base region of a second conductivity type provided on the drift layer;
a source region of the first conductivity type selectively provided on a surface of the base region;
a first gate electrode contacting the source region, the base region, and the drift layer via a first insulating film;
a field-plate electrode provided under the first gate electrode via a second insulating film, the field-plate electrode contacting the drift layer via the second insulating film;
a second gate electrode contacting the source region, the base region, and the drift layer via a third insulating film, and the second gate electrode being positioned between the first gate electrodes;
a drain electrode connected to the drain layer; and
a source electrode connected to the source region and the base region.

2. The device according to claim 1, wherein
a lower end of the field-plate electrode is located at a position deeper than a lower end of the second gate electrode in the drift layer.

3. The device according to claim 1, wherein
an impurity concentration of the drift layer is not more than $1\times10^{17}$ (atoms/cm$^3$).

4. The device according to claim 1, wherein
a pitch of the first gate electrodes is not less than 0.6 μm.

5. The device according to claim 1, wherein
a plurality of the second gate electrodes are provided between the first gate electrodes.

6. The device according to claim 1, wherein
when viewed from a direction perpendicular to a main surface of the drift layer, the first gate electrode and the second gate electrode extend in a first direction.

7. The device according to claim 1, wherein
when viewed from a direction perpendicular to a main surface of the drift layer,
some of the plurality of first gate electrodes extend in a first direction,
the other some of the plurality of first gate electrodes extend in a second direction substantially perpendicular to the first direction, and
the some of the plurality of first gate electrodes and the other some of the plurality of first gate electrodes cross each other.

8. The device according to claim 7, wherein
when viewed from a direction perpendicular to a main surface of the drift layer,
the second gate electrode is surrounded by the some of the plurality of first gate electrodes extending in the first direction and the other some of the plurality of first gate electrodes extending in the second direction.

9. The device according to claim 7, wherein
when viewed from a direction perpendicular to a main surface of the drift layer, a plurality of second gate electrodes are provided,
some of the plurality of second gate electrodes extend in a first direction,
the other some of the plurality of second gate electrodes extend in a second direction substantially perpendicular to the first direction,
the some of the plurality of second gate electrodes and the other some of the plurality of second gate electrodes cross each other, and
some of the plurality of second gate electrodes and the other some of the plurality of first gate electrodes cross each other, and the other some of the plurality of second gate electrodes and some of the plurality of first gate electrodes cross each other.

10. The device according to claim 1, wherein
when viewed from a direction perpendicular to a main surface of the drift layer, a shape of the region surrounded by the second gate electrodes is one of a triangle, a quadrangle, a hexagon and a circle.

11. A semiconductor device comprising:
a drain layer of a first conductivity type;
a drift layer of the first conductivity type provided on the drain layer;
a drift region of a second conductivity type provided on the drift layer;
a source region of the first conductivity type provided on a surface of the base region;
a contact region contacting the source region and the base region;
a field-plate electrode provided under the contact region, and the field-plate electrode contacting the drift region via a second insulating film;

a gate electrode contacting the source region, the base region, and the drift layer via the third insulating film, and the gate electrode being positioned between the contact regions;
a drain electrode connected to the drain layer; and
a source electrode connected to the source region and the contact region.

12. The device according to claim 11, wherein a lower end of the field-plate electrode is located at a position deeper than a lower end of the gate electrode in the drift layer.

13. The device according to claim 11, wherein the contact region is connected to the field-plate electrode.

14. The device according to claim 11, wherein an impurity concentration of the drift layer is not more than $1\times10^{17}$ (atoms/cm$^3$).

15. The device according to claim 11, wherein a pitch of the contact regions is not less than 0.6 μm.

16. The device according to claim 11, wherein a plurality of the gate electrodes are provided between the contact regions.

17. The device according to claim 11, wherein when viewed from a direction perpendicular to a main surface of the drift layer, the contact region and the gate electrode extend in a first direction.

18. The device according to claim 11, wherein
when viewed from a direction perpendicular to a main surface of the drift layer,
a plurality of the gate electrodes are provided,
some of the plurality of gate electrodes extend in a first direction,
the other some of the plurality of gate electrodes extend in a second direction substantially perpendicular to the first direction, and
the some of the plurality of gate electrodes and the other some of the plurality of gate electrodes cross each other.

19. The device according to claim 18, wherein
when viewed from a direction perpendicular to a main surface of the drift layer,
the contact region is surrounded by the some of the plurality of gate electrodes extending in the first direction and the other some of the plurality of gate electrodes extending in the second direction.

20. The device according to claim 11, wherein
when viewed from a direction perpendicular to a main surface of the drift layer, a shape of the region surrounded by the gate electrodes is one of a triangle, a quadrangle, a hexagon and a circle.

* * * * *